(12) United States Patent
Lee et al.

(10) Patent No.: US 7,369,445 B2
(45) Date of Patent: May 6, 2008

(54) METHODS OF OPERATING MEMORY SYSTEMS INCLUDING MEMORY DEVICES SET TO DIFFERENT OPERATING MODES AND RELATED SYSTEMS

(75) Inventors: Kee-hoon Lee, Gyeonggi-do (KR); Chang-sik Yoo, Seoul (KR); Kye-hyun Kyung, Gyeonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 312 days.

(21) Appl. No.: 11/315,470

(22) Filed: Dec. 22, 2005

(65) Prior Publication Data

US 2006/0161745 A1    Jul. 20, 2006

Related U.S. Application Data

(63) Continuation-in-part of application No. 10/916,156, filed on Aug. 11, 2004, now Pat. No. 7,102,958, and a continuation-in-part of application No. 10/199,857, filed on Jul. 19, 2002, now Pat. No. 6,834,014.

(30) Foreign Application Priority Data

Jul. 20, 2001  (KR) .......................... 2001-0043789
May 8, 2004   (KR) .......................... 2004-0032500
Dec. 24, 2004  (KR) .......................... 2004-0112199

(51) Int. Cl.
*G11C 7/10* (2006.01)

(52) U.S. Cl. ..................... 365/189.04; 365/230.03; 365/230.06

(58) Field of Classification Search ........... 365/189.04, 365/230.03, 230.06
See application file for complete search history.

(56) References Cited

U.S. PATENT DOCUMENTS

| 5,617,367 | A  | 4/1997  | Holland et al. |
| 6,151,648 | A  | 11/2000 | Haq            |
| 6,157,688 | A  | 12/2000 | Tamura et al.  |
| 6,343,036 | B1 | 1/2002  | Park et al.    |

(Continued)

FOREIGN PATENT DOCUMENTS

KR    2003-0008327    1/2003

OTHER PUBLICATIONS

Notice to Submit a Response for Korean Patent Application No. 2003-0008327 mailed on Mar. 27, 2006.

*Primary Examiner*—Tuan T. Nguyen
(74) *Attorney, Agent, or Firm*—Myers, Bigel, Sibley & Sajovec, P.A.

(57) ABSTRACT

A method of operating a memory system including a plurality of memory devices coupled to a command address bus may be provided. In particular, a first memory device of the plurality of memory devices may be set to a first operating mode, and a second memory device of the plurality of memory devices may be set to a second operating mode different than the first operating mode. In addition, a read/write operation may be performed responsive to a read/write command address signal provided over the command address bus to the plurality of memory devices so that the first memory device operates according to the first operating mode during the read/write operation and so that the second memory device operates according to the second operating mode during the read/write operation. Related systems are also discussed.

20 Claims, 28 Drawing Sheets

U.S. PATENT DOCUMENTS

| | | |
|---|---|---|
| 6,356,106 B1 | 3/2002 | Greeff et al. |
| 6,438,063 B1 | 8/2002 | Lee |
| 6,493,394 B2 | 12/2002 | Tamura et al. |
| 6,502,212 B1 | 12/2002 | Coyle et al. |
| 6,519,173 B2 | 2/2003 | Funaba et al. |
| 6,665,222 B2 | 12/2003 | Wright et al. |
| 7,039,782 B2 * | 5/2006 | Garrett et al. .............. 711/167 |
| 7,142,461 B2 | 11/2006 | Janzen |
| 7,155,627 B2 * | 12/2006 | Matsui ........................ 713/401 |
| 2004/0105292 A1 * | 6/2004 | Matsui ........................ 365/63 |

* cited by examiner

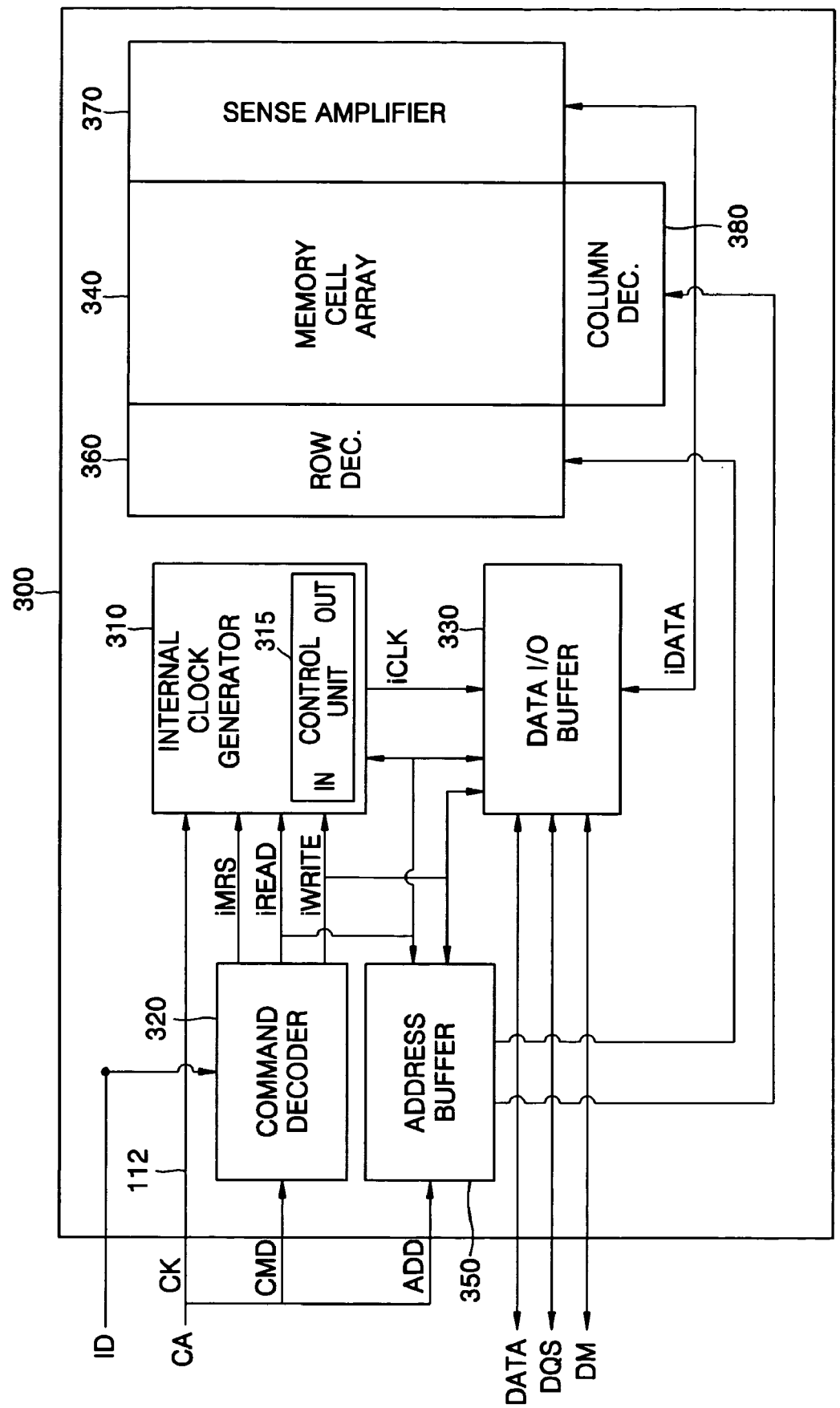

FIG. 7B

| COMMAND | TIMING ADJUSTMENT |
|---|---|
| MRS1 | +4T |
| MRS2 | +3T |
| MRS3 | +2T |
| MRS4 | +1T |
| MRS5 | 0 |
| MRS6 | −1T |
| MRS7 | −2T |
| MRS8 | −3T |
| MRS9 | −4T |

FIG. 22
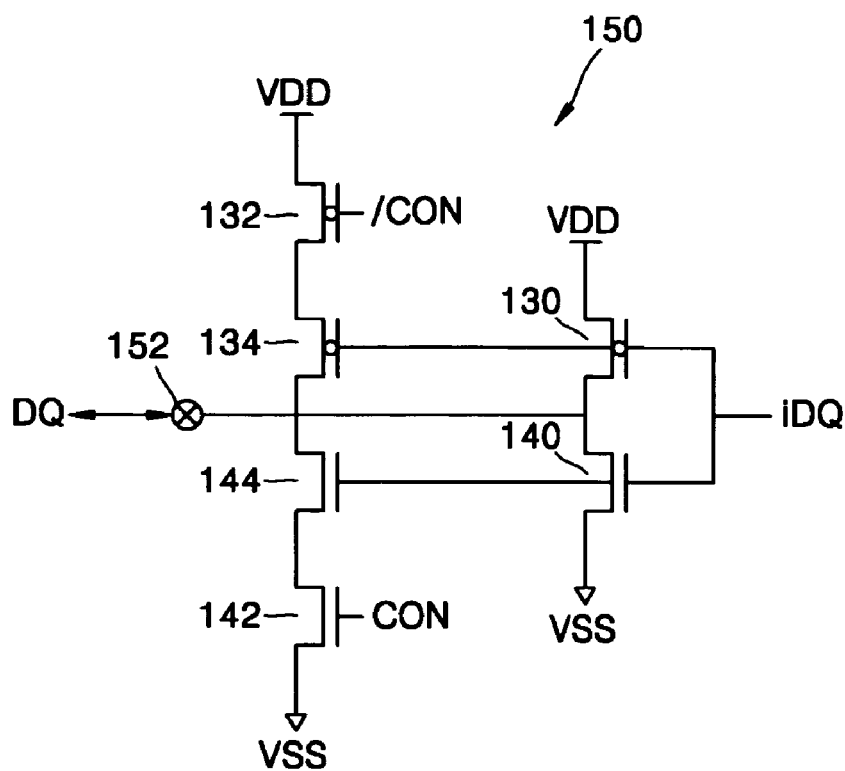
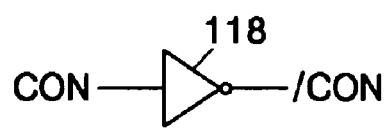
CON(HIGH) → INCREASE THE DRIVER STRENGTH
CON(LOW) → REDUCE THE DRIVER STRENGTH

METHODS OF OPERATING MEMORY SYSTEMS INCLUDING MEMORY DEVICES SET TO DIFFERENT OPERATING MODES AND RELATED SYSTEMS

RELATED APPLICATIONS

The present application claims the benefit of priority as a Continuation-In-Part application of U.S. patent application Ser. No. 10/916,156 filed on Aug. 11, 2004 now U.S. Pat. No. 7,102,958, which claims the benefit of priority as a Continuation-In-Part application of U.S. patent application Ser. No. 10/199,857 filed on Jul. 19, 2002 now U.S. Pat. No. 6,834,014. In addition, the present application claims the benefit of priority from Korean Application No. 2004-0112199 filed Dec. 24, 2004; U.S. patent application Ser. No. 10/916,156 claims the benefit of priority from Korean Application No. 2004-0032500 filed May 8, 2004; and U.S. patent application Ser. No. 10/199,857 claims the benefit of priority from Korean Application No. 2001-0043789 filed Jul. 20, 2001. The present application thus claims the benefit of priority from U.S. patent application Ser. No. 10/916,156, U.S. patent application Ser. No. 10/199,857, Korean Application No. 2004-0112199, Korean Application No. 2004-0032500, and Korean Application No. 2001-0043789, and the disclosures of all of the above referenced U.S. and Korean Patent Applications are hereby incorporated herein in their entirety by reference.

FIELD OF THE INVENTION

The present invention relates to the field of electronics, and more particularly, to electronic memories and related methods.

BACKGROUND

Generally, in a DRAM (Dynamic Random Access Memory), an operation mode and/or various parameters, such as CAS (column address strobe) latency and burst length, may be set by a MRS (Mode Register Set) command. In semiconductor memory devices, a rank refers to a plurality of DRAMs controlled by a chip selection signal. A rank or a plurality of ranks can be installed in a memory system.

DRAMs belonging to a same rank may share buses through which chip selection signals, commands, and address signals are transmitted. Accordingly, if a MRS command is transmitted through an address bus, all DRAMs belonging to a corresponding rank may be set to the same operation mode. However, operation modes and/or parameters of DRAMs belonging to the same rank should be individually controlled.

FIG. 1 is a block diagram of a conventional memory system 100. Referring to FIG. 1, the memory system 100 includes a memory controller 10 and a memory module 20. The memory module 20 includes a plurality of memory devices 30. The memory devices 30 may be controlled according to a chip selection signal (not shown). That is, the memory module 20 shown in FIG. 1 includes a rank. Each memory device 30 receives a clock signal CK and a command address signal CA from the memory controller 10. Also, each memory device 30 receives/transmits data DATA1 through DATA9 and a data strobe signal (not shown) from/to the memory controller 10.

FIG. 2 is a block diagram of an individual memory device 30 shown in FIG. 1. Referring to FIG. 2, the memory device 30 includes a command decoder 31, an internal clock generator 32, a data input/output buffer 34, and a memory cell array 36. The command decoder 31 receives and decodes a command address CA from the memory controller 10 and generates an internal command. Here, the internal command may be a write command IWRITE, a read command IREAD, or a MRS command IMRS, according to a received command address CA. The internal clock generator 32 generates an internal clock signal ICLK in response to a clock signal CK and the internal command IMRS, IREAD, or IWRITE.

The data input/output buffer 34 stores data DATA input with a data strobe signal DQS, as internal data IDATA, in the memory cell array 36, in response to the internal clock signal ICLK. The data input/output buffer 34 outputs internal data IDATA stored in the memory cell array 36 to an external memory controller 10 in response to the internal clock signal ICLK.

Although the memory devices 30 receive data IDATA from the memory controller 10 at the same time, the memory devices 30 may respectively receive a clock signal CK at different times because the respective memory devices 30 may sequentially receive the clock signal CK per a delay T. As a result, the respective memory devices 30 may generate internal clock signals ICLK at different times, in response to the clock signal CK. Since the respective memory devices 30 generate the internal clock signals ICLK at different times, the data IDATA may also be stored and/or output at different times.

FIG. 3 is a timing diagram illustrating a data read operation performed by the memory system 100 shown in FIG. 1. Referring to FIG. 3, data read operations performed by a first memory device M1, a fifth memory device M5, and a ninth memory device M9 of the memory module 20 will be described. As shown in FIG. 3, the first memory device M1, the fifth memory device M5, and the ninth memory device M9 receive clock signals CK1, CK5, and CK9, at different times, respectively.

Accordingly, the memory devices M1, M5, and M9 generate first, fifth, and ninth internal clock signals ICLK1, ICLK5, and ICLK9, at different times, respectively. In FIG. 3, the first internal clock signal ICLK1 may be generated earlier than the fifth internal clock signal ICLK5 by a period 4T, and the fifth internal clock signal ICLK5 may be generated earlier than the ninth internal clock signal ICLK9 by a period 4T.

Referring to FIG. 3, when data is read, internal data IDATA stored in the memory cell array 36 may be output in synchronization with the internal clock signal ICLK1, ICLK5, or ICLK9. As shown in FIG. 3, first data DATA1, fifth data DATA5, and ninth data DATA9 may be respectively output at different times. In other words, the first, fifth, and ninth data DATA1, DATA5, and DATA9 may have a data skew DSK.

FIG. 4 is a timing diagram illustrating a data write operation performed by the memory system 100 shown in FIG. 1. Referring to FIG. 4, the first memory device M1, the fifth memory device M5, and the ninth memory device M9 may receive clock signals CK1, CK5, and CK9 at different times, respectively.

Accordingly, the memory devices M1, M5, and M9 may generate first, fifth, and ninth internal clock signals ICLK1, ICLK5, and ICLK9 at different times, respectively. In FIG. 4, the first internal clock signal ICLK1 may be generated earlier than the fifth internal clock signal ICLK5 by a period 4 T, and the fifth internal clock signal ICLK5 may be generated earlier than the ninth internal clock signal ICLK9 by a period 4 T. When data is written, data DATA received from the outside may be stored in the memory cell array 36 in synchronization with the internal clock signal ICLK1, ICLK5, or ICLK9. Referring to FIG. 4, first internal data IDATA1, fifth internal data IDATA5, and ninth internal data IDATA9 may be generated at different times. That is, the internal data IDATA1, IDATA5, and IDATA9 stored in the memory cell array 36 may have data skew DSK.

Because the memory devices 30 of the memory module 20 shown in FIG. 1 may receive a clock signal CK at different times, skew may be generated when data is stored or read. Accordingly, synchronization of internal clock signals ICLK from the memory devices 30 may be desired.

SUMMARY

According to some embodiments of the present invention, methods of operating a memory system including a plurality of memory devices coupled to a command address bus may be provided. In particular, a first memory device of the plurality of memory devices may be set to a first operating mode, and a second memory device of the plurality of memory devices may be set to a second operating mode different than the first operating mode. A read/write operation may be performed responsive to a read/write command address signal provided over the command address bus to the plurality of memory devices. Accordingly, the first memory device operates according to the first operating mode during the read/write operation, and the second memory device operates according to the second operating mode during the read/write operation.

Setting the first memory device to the first operating mode may include providing a first mode set command address signal to the plurality of memory devices and providing an identification signal to the first memory device without providing an identification signal to the second memory device. Setting the second memory device to the second operating mode may include providing a second mode set command address signal to the plurality of memory devices and providing an identification signal to the second memory device without providing an identification signal to the first memory device. Moreover, providing the identification signals to the first and second memory devices may include providing the identification signals to one of a data pin, a data mask pin, and/or a data strobe pin of the respective memory device. In addition, the first mode set command address signal may include a Mode Register Set (MRS) command.

The first operating mode may include a refresh mode, and the second operating mode may include a deep power down mode. Moreover, performing the read/write operation may include performing the read/write operation responsive to the read/write command address signal and responsive to a clock signal provided over the command address bus to the plurality of memory devices.

According to some additional embodiments of the present invention a memory system may include a memory module including a plurality of memory devices and a memory controller coupled to the memory module. More particularly, the memory controller is configured during a mode set operation to provide an identification signal to a first memory device of the plurality of memory devices without providing an identification signal to a second memory device of the plurality of memory devices to set the first memory device to a first operation mode different than a second operation mode of the second memory device. In addition, the memory controller may be configured during a read/write operation to read/write data from/to at least one of the plurality of memory devices with the first memory device operating according to the first operation mode and with the second memory device operating according to the second operation mode.

The memory controller may be configured to provide a first command address signal to the plurality of memory devices during the mode set operation and to provide a second command address signal to the plurality of memory devices during the read/write operation, and the first and second command address signals may be different. Moreover, the first command address signal may be a Mode Register Set (MRS) command. In addition, the memory controller may be configured to generate the identification signal when a third bank address of three bank addresses of the Mode Register Set command is high during the mode set operation. The memory controller may also be configured to suppress the identification signal when the third bank address of the three bank addresses of the Mode Register Set command is low during a second mode set operation.

During the mode set operation, the identification signal may be activated for the first memory device and deactivated for the second memory device. Moreover, the first operation mode may be a refresh mode and the second operation mode may be a deep power down mode. In addition, the identification signal may be provided from the memory controller to one of a data pin, a data mask pin, and/or a data strobe pin of the first memory device.

According to some more embodiments of the present invention, a memory system may include first and second pluralities of memory devices coupled to a command address signal bus. During a read/write operation, the first plurality of memory devices may be configured to operate according to a first operation mode responsive to a command address signal on the command address signal bus. During the read/write operation, the second plurality of memory devices may be configured to operate according to a second operation mode responsive to the command address signal on the command address signal bus.

The first plurality of memory devices may be configured to change to the second operation mode responsive to an identification signal provided to the first plurality of memory devices and a command address signal provided to the first and second pluralities of memory devices. Moreover, the first operation mode may be a refresh mode and the second operation mode may be a deep power down mode. The first and second pluralities of memory devices may be configured to operate responsive to the command address signal and responsive to a clock signal on the command address signal bus. A memory controller may be coupled to the command address signal bus, and the memory controller may be configured to generate the command address signal.

According to yet more embodiments of the present invention, a memory system may include a memory module and a memory controller. The memory module may include a plurality of memory devices, and the memory controller may generate an identification signal used to separately control operations of corresponding ones of the memory devices using a clock signal and a command address signal. In a first mode, operation modes of the memory devices may be set different from each other according to the command address signal, in response to the identification signal. In a second mode, the memory devices may respectively operate in the operation modes set in the first mode, in response to a predetermined command address signal.

The memory devices may be respectively set to the operation modes according to the command address signal if the identification signal is activated, and, if the identification signal is deactivated, the memory devices do not respond to the command address signal. A portion of the memory devices may be set to a refresh mode and another portion of the plurality of memory devices may be set to a deep power down mode, in response to the command address signal, if the identification signal is activated. The command address signal may be a MRS (Mode Register Set) command. Moreover, the MRS command may set a mode in which the memory controller does not generate the identification signal if a third bank address among three bank addresses of MRS key address codes is low, and may set a mode in which the memory controller generates the identification signal if the third bank address among the three bank addresses of the MRS key address codes is high.

The identification signal may be input to one of a data pin, a data mask pin, and a data strobe pin of a corresponding memory device. Moreover, the first mode may be a mode used to set the operation modes of the memory devices before the memory devices operate normally, and the second mode may be a mode for normally operating the memory devices.

According to still more embodiments of the present invention, a memory system may include a plurality of first memory devices and a plurality of second memory devices. The first and second memory devices may be set to operation modes in response to an identification signal. Moreover, the first memory devices may perform a different operation from the second memory devices according to a command address signal in a normal operation mode.

In a first mode, an operation mode of the first memory devices may be set different from that of the second memory devices in response to a corresponding identification signal and a predetermined command address signal. In the first mode, the first and second memory devices may be set to the operation modes in response to the command address signal if the identification signal is activated, and, if the identification signal is deactivated, the first and second memory devices may not respond to the command address signal.

In the first mode, the first memory devices may be set to a refresh mode and the second memory devices may be set to a deep power down mode, in response to the command address signal if the identification signal is activated. The command address signal may be a MRS (Mode Register Set) command. The MRS command may set a mode in which the memory controller does not generate the identification signal if a third bank address among three bank addresses of MRS key address codes is low, and may set a mode in which the memory controller generates the identification signal if the third bank address among the three bank addresses of the MRS key address codes is high. The first mode may be a mode for setting the operation modes of the memory devices before the memory devices operate normally. The identification signal may be input to one of a data pin, a data mask pin, and a data strobe pin of a corresponding memory device. In addition, a memory controller may be provided to control operations of the memory devices using a clock signal and the command address signal and to generate the identification signal.

According to additional embodiments of the present invention, a memory system may include a first memory device and a second memory device. Moreover, the first and second memory devices may perform different operations in response to a command address signal in a normal operation mode.

In a first mode, an operation mode of the first memory device may be set different from that of the second memory device in response to a chip selection signal and a predetermined command address signal. In the first mode, the first and second memory devices may be respectively set to corresponding operation modes in response to the command address signal if the chip selection signal is activated, and, if the chip selection signal is deactivated, the first and second memory devices may not respond to the command address signal.

The first memory device may be set to a refresh mode and the second memory device may be set to a deep power down mode, in response to the command address signal if the chip selection signal is activated. The command address signal may be a MRS (Mode Register Set) command. Moreover, the MRS command may set a mode in which the memory controller does not generate the identification signal if a third bank address among three bank addresses of MRS key address codes is low, and may set a mode in which the memory controller generates the identification signal if the third bank address among the three bank addresses of the MRS key address codes is high. The first mode may be a mode used to set the operation modes of the first and second memory devices before the first and second memory devices operate normally.

In addition, a memory controller may control operations of the first and second memory devices using a clock signal and the command address signal and may generate the chip selection signal. The first memory device may directly receive the clock signal and the command address signal from the memory controller, and the second memory device may receive the clock signal and the command address signal through the first memory device. The first and second memory devices may directly receive the clock signal and the command address signal from the memory controller.

According to still more embodiments of the present invention, a memory system may include a plurality of first memory modules and a plurality of second memory modules, and each of the first and second memory modules may include a plurality of memory devices. Moreover, the first memory module may perform a different operation from the second memory modules in response to a command address signal in a normal operation mode.

In a first mode, an operation mode of the first memory modules may be set different from that of the second memory modules in response to a chip selection signal and a predetermined command address signal. In the first mode, the first and second memory modules may be set to corresponding operation modes in response to the command address signal if the chip selection signal is activated, and, if the chip selection signal is deactivated, the first and second memory modules may not respond to the command address signal.

In the first mode, the first memory modules may be set to a refresh mode and the second memory modules may be set to a deep power down mode, in response to the command address signal, if the chip selection signal is activated. The command address signal may be a MRS (Mode Register Set) command. The MRS command may set a mode in which the memory controller does not generate the identification signal if a third bank address among three bank addresses of MRS key address codes is low, and may set a mode in which the memory controller generates the identification signal if the third bank address among the three bank addresses of the MRS key address codes is high. The first mode may be a mode used to set the operation modes of the first and second memory modules before the first and second memory modules operate normally. In addition, a memory controller may control operations of the first and second memory modules using a clock signal and the command address signal and may generate the chip selection signal.

According to some embodiments of the present invention, memory systems may include memory devices wherein operation modes are separately set.

According to some other embodiments of the present invention, methods may be provided that separately set operation modes of memory devices included in a memory system.

BRIEF DESCRIPTION OF DRAWINGS

FIG. 6A is a block diagram illustrating memory devices according to embodiments of the present invention.

FIG. 7B is a table illustrating mode register set commands for internal clock signal timing adjustment according to embodiments of the present invention.

FIG. 22 is a schematic diagram illustrating output drivers according to embodiments of the present invention.

DETAILED DESCRIPTION

Figure 1:
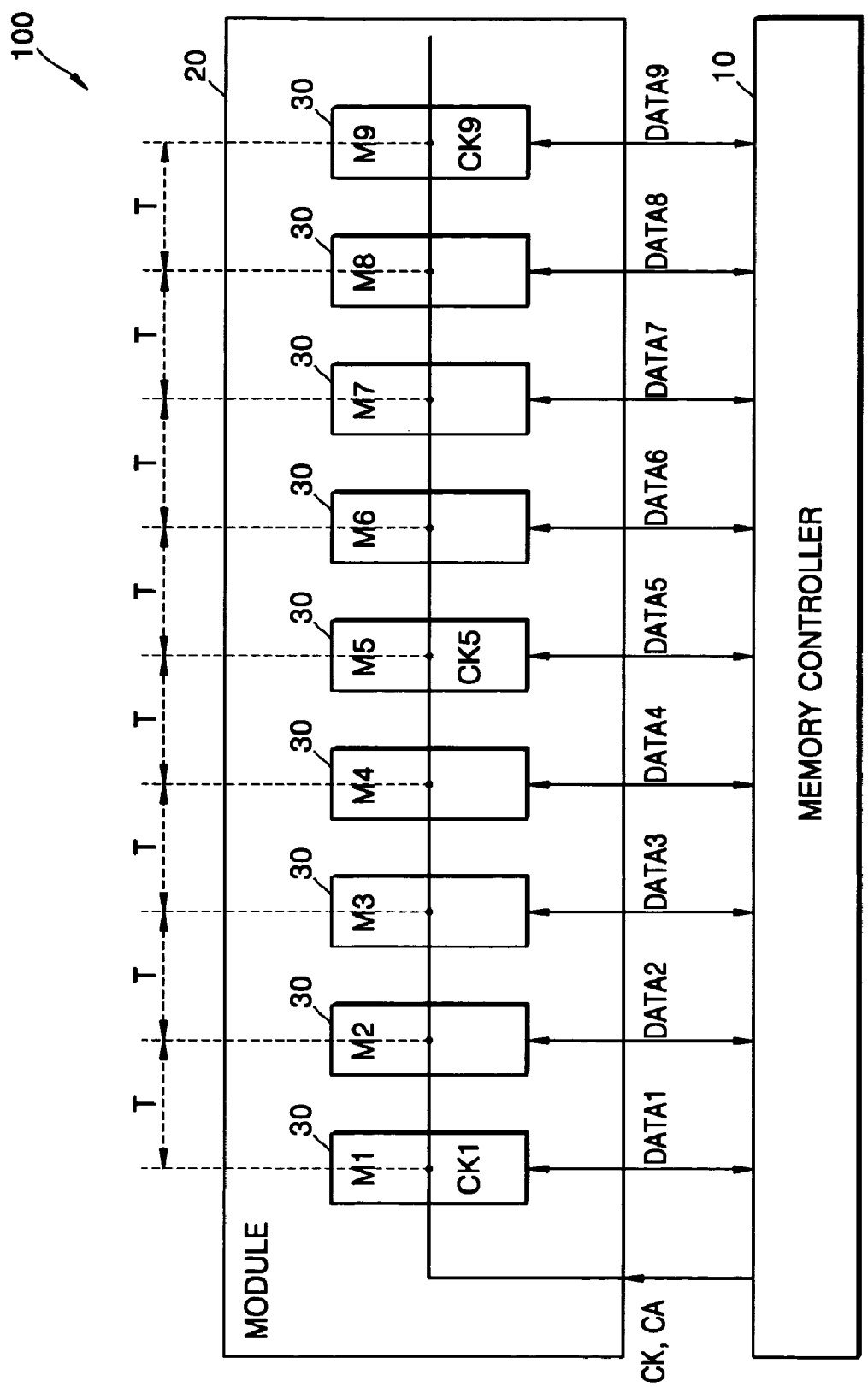
FIG. 1 is a block diagram illustrating a conventional memory system including a memory module and a memory controller.
Figure 2:
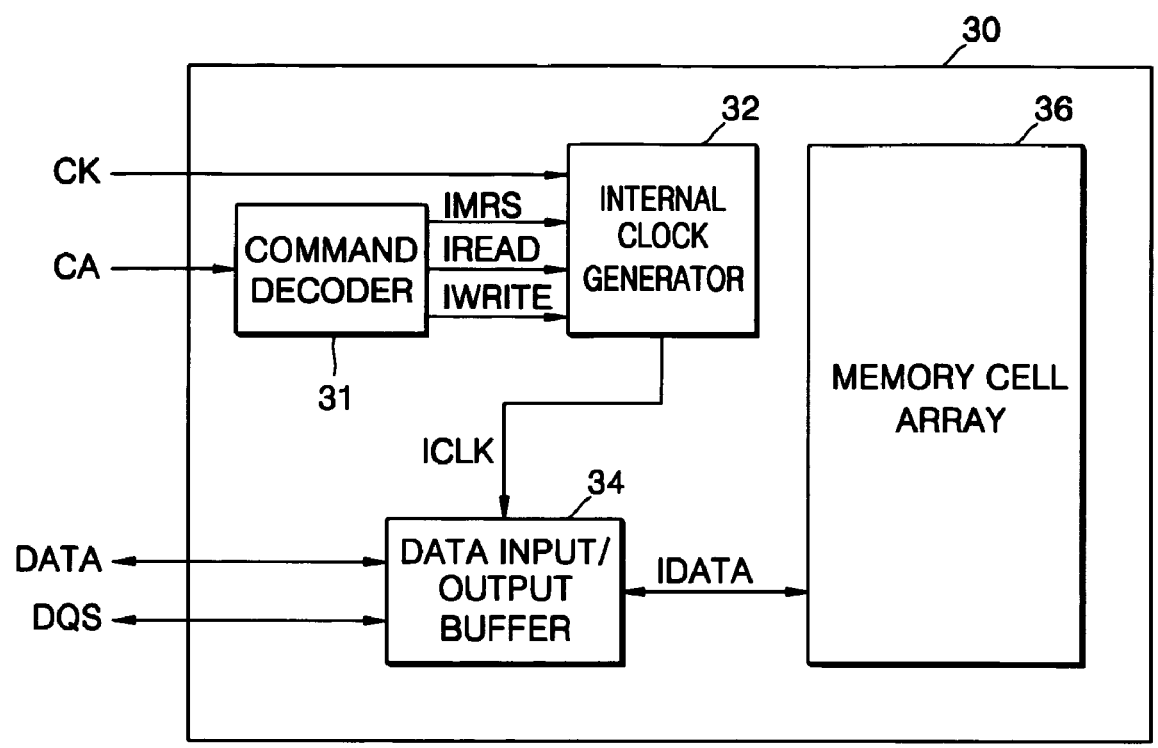
FIG. 2 is a block diagram illustrating a conventional memory device.
Figure 3:
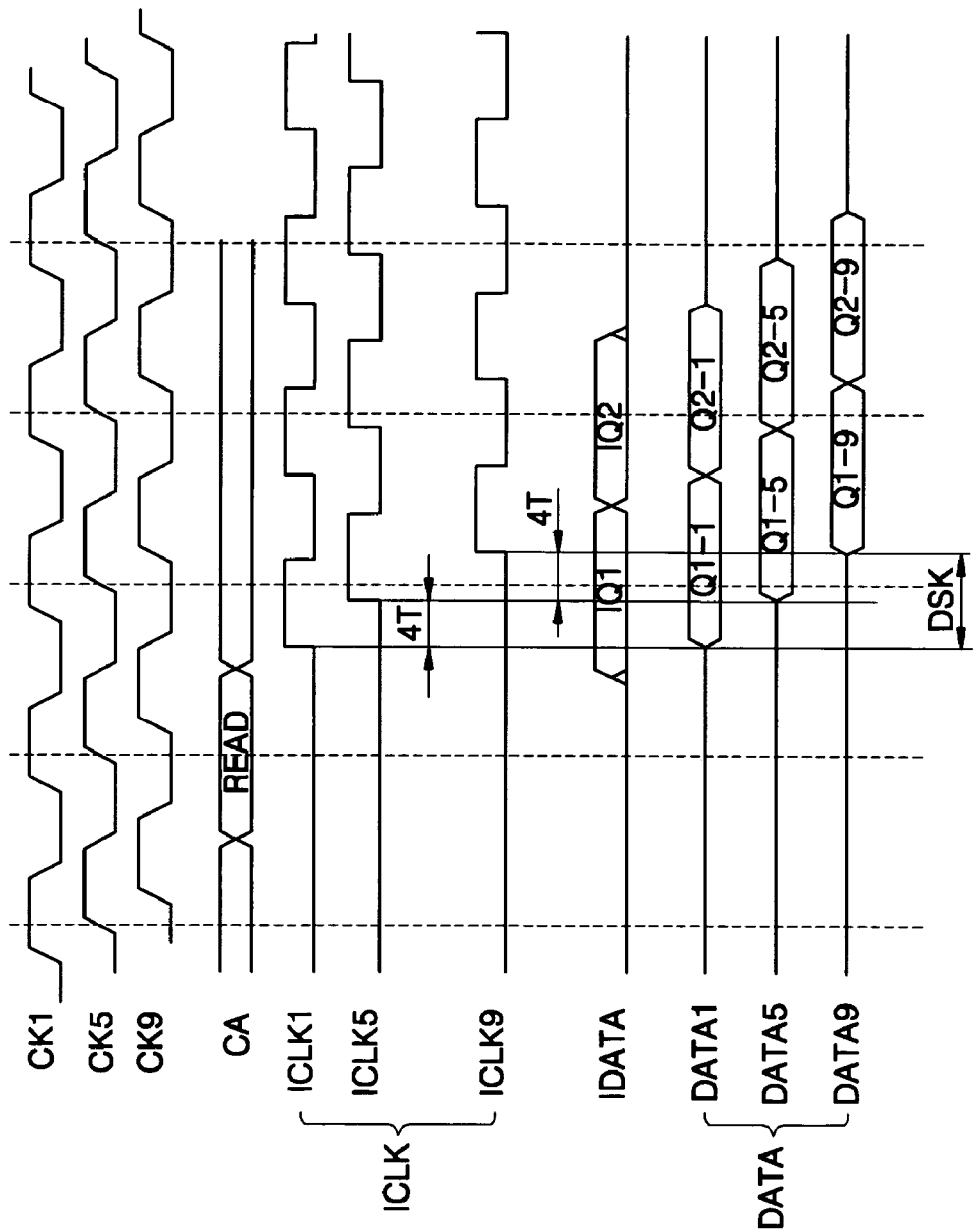
FIG. 3 is a timing diagram illustrating a read operation of a conventional memory system.
Figure 4:
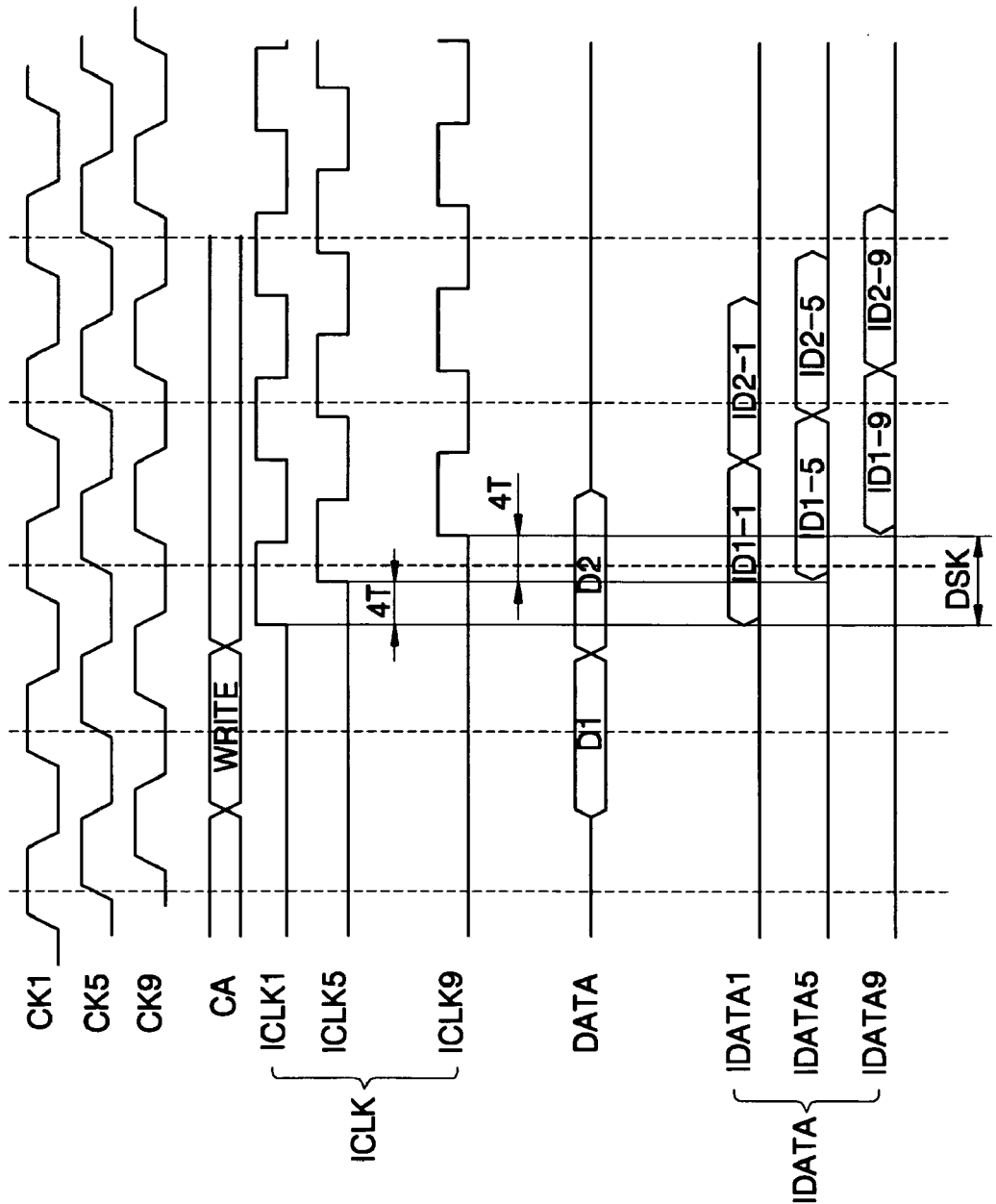
FIG. 4 is a timing diagram illustrating a write operation of a conventional memory system.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
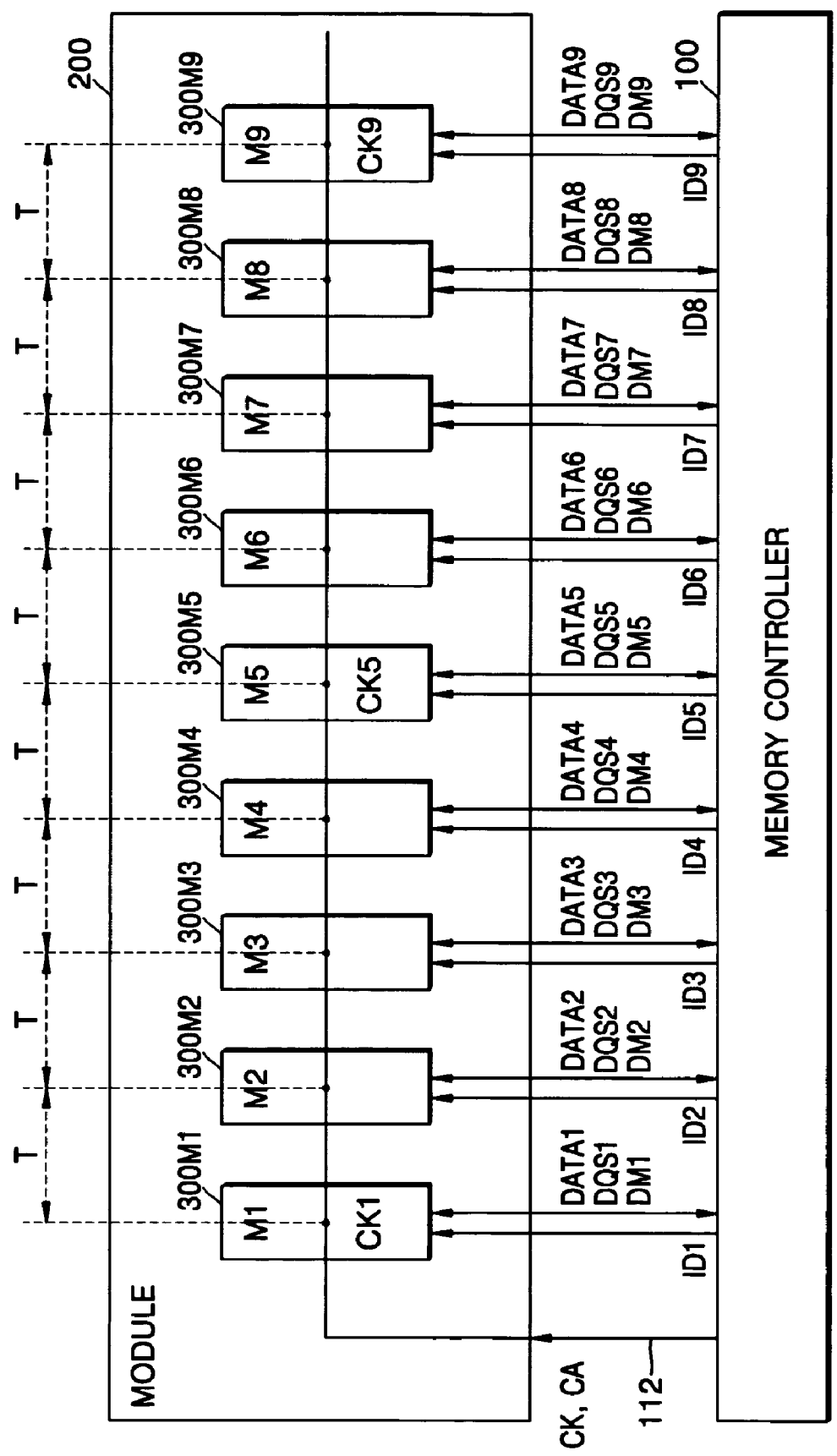
FIG. 5 is a block diagram illustrating memory systems including memory modules and memory controllers according to embodiments of the present invention.

In a digital memory system according to embodiments of the present invention illustrated in FIG. 5, a memory controller 100 may control operations of a memory module 200 including a plurality of memory devices 300M1-300M9. More particularly, each memory device 300 may be an integrated circuit dynamic random access memory device.

Data signals DATA1-DATA9 can be transmitted between the memory controller 100 and the separate memory devices 300M1-300M9 using separate data signal bus lines. During a read operation, data signals DATA1-DATA9 can be read from memory devices 300M1-300M9 to the memory controller 100 over separate data bus lines at the same time, and during a write operation, data signals DATA1-DATA9 can be written from the memory controller 100 to the memory devices 300M1-300M9 at the same time. In addition, separate lines for data strobe signals DQS1-DQS9 and separate lines for data mask signals DM1-DM9 are provided between the memory controller 100 and each of the memory devices 300M1-300M9.

Moreover, separate lines for mode register set enable/disable signals ID1-ID9 are provided between the memory controller 100 and each of the memory devices 300M1-300M2. For example, separate dedicated lines may be provided between the memory controller and dedicated mode register set enable/disable pins on each of the memory devices. In an alternative, lines used to transmit the data strobe signals DQS1-DQS9 during read/write operations, lines used to transmit data signals DATA1-DATA9 during read/write operations, or lines used to transmit the data mask signals DM1-DM9 during read/write operations may be used to separately transmit the mode register set enable/disable signals ID1-ID9 to each of the memory devices 300M1-300M9 during mode register set operations.

Accordingly, a propagation delay between the memory controller 100 and each of the memory devices 300M1-300M9 may be approximately the same for data signals DATA1-DATA9, for data strobe signals DQS10-DQS9, for data mask signals DM1-DM9, and for mode register set enable/disable signals ID1-ID9. The arrangement of FIG. 5 with separate data buses between the memory controller 100 and each of the memory devices 300M1-300M9 may be referred to as providing point-to-point connections.

In contrast, a clock/command/address bus 112 may couple control/address signals CA and a system clock signal CK from the memory controller 100 to each of the memory devices 300M1-300M9. Accordingly, a length of the transmission line for the clock signal CK may be different for each of the memory devices 300M1-300M2 so that a propagation delay of the clock signal CK may vary for each of the memory devices 300M1-300M9. If the memory devices 300M1-300M9 are evenly spaced along the control/address/clock bus 112, the clock signal CK may experience an incremental propagation delay T (also referred to as a phase difference or phase shift) for each memory device 300M1-300M9 in the memory module 200. Arbitrarily assigning a propagation delay of 0 for the first memory device 300M1, for example, the clock signal CK propagation delay of T may result at second memory device 300M2, a propagation delay of 2T may result at memory device 300M3, a propagation delay of 3T may result at memory device 300M4, a propagation delay of 4T may result at memory device 300M5, a propagation delay of 5T may result at memory device 300M6, a propagation delay of 6T may result at memory device 300M7, a propagation delay of 7T may result at memory device 300M8, and a propagation delay of 8T may result at memory device 300M9. The arrangement of FIG. 5 with the clock signal CK being provided to each of the memory devices 300M1-300M9 may be referred to as providing a fly-by clock.

Reading and writing data signals DATA1-DATA9 provided over respective point-to-point data buses may be synchronized using the fly-by system clock signal CK provided to each of the memory devices 300M1-300M9 over a same system clock signal line of the clock/command/address bus 112. According to embodiments of the present invention, however, each of the memory devices 300M1-300M9 may include an internal clock signal generator configured to adjust a timing of the internal clock signal so that the internal clock signals of the different memory devices 300M1-300M9 may be approximately synchronized even though the system clock signal is received at the different memory devices with different propagation delays. More particularly, the timing of each internal clock signal may be adjusted relative to the system clock signal CK as received at the respective memory device responsive to a value stored in a mode register of the memory device. Accordingly, mode registers of different memory devices may be programmed with different values to compensate for differences in the propagation delays of the system clock signal CK received at the different memory devices.

The mode register set enable/disable signals ID1-ID9, for example, may be used to enable or disable individual ones of the memory devices 300M1-300M9 during a selective mode register set operation when a same mode register set command is applied to all of the memory devices 300M1-300M9 over address lines of the clock/command/address bus 112. For example, during a first selective mode register set operation, an enabling mode register set enable/disable signal ID1 may be applied to memory device 300M1, and disabling mode register set enable/disable signals ID2-ID9 may be applied to memory devices 300M2-300M9. During a second selective mode register set operation, an enabling mode register set enable/disable signal ID2 may be applied to memory device 300M2, and disabling mode register set enable/disable signals ID1 and ID3-ID9 may be applied to memory devices 300M1 and 300M3-300M9. During a third selective mode register set operation, an enabling mode register set enable/disable signal ID3 may be applied to memory device 300M3, and disabling mode register set enable/disable signals ID1-ID2 and ID4-ID9 may be applied to memory devices 300M1-300M2 and 300M4-300M9. During a fourth selective mode register set operation, an enabling mode register set enable/disable signal ID4 may be applied to memory device 300M4, and disabling mode register set enable/disable signals ID1-ID3 and ID5-ID9 may be applied to memory devices 300M1-300M3 and 300M5-300M9. During a fifth selective mode register set operation, an enabling mode register set enable/disable signal ID5 may be applied to memory device 300M5, and disabling mode register set enable/disable signals ID1-ID4 and ID6-ID9 may be applied to memory devices 300M1-300M4 and 300M6-300M9. During a sixth selective mode register set operation, an enabling mode register set enable/disable signal ID6 may be applied to memory device 300M6, and disabling mode register set enable/disable signals ID1-ID5 and ID7-ID9 may be applied to memory devices 300M1-300M5 and 300M7-300M9. During a seventh selective mode register set operation, an enabling mode register set enable/disable signal ID7 may be applied to memory device 300M7, and disabling mode register set enable/disable signals ID1-ID6 and ID8-ID9 may be applied to memory devices 300M1-300M6 and 300M8-300M9. During an eighth selective mode register set operation, an enabling mode register set enable/disable signal ID8 may be applied to memory device 300M8, and disabling mode register set enable/disable signals ID1-ID7 and ID9 may be applied to memory devices 300M1-300M7 and 300M9. During a ninth selective mode register set operation, an enabling mode register set enable/disable signal ID9 may be applied to memory device 300M9, and disabling mode register set enable/disable signals ID1-ID8 may be applied to memory devices 300M1-300M8.

Accordingly, a series of nine selective mode register set operations may be used to program nine different memory devices for different modes of operations. For example, different ones of the memory devices 300M1-300M9 may be programmed to provide different timing adjustments of the respective internal clock signals relative to the system clock signal CK received at the respective memory devices. Internal clock signals of the different memory devices may thus be approximately synchronized despite different propagation delays for the system clock signal CK received at the respective memory devices. In an alternative or in addition, different ones of the memory devices 300M1-300M9 may be programmed to provide different driver output characteristics (such as driver strengths) for data signals DATA1-DATA9 read by the memory controller 100. In another alternative or in addition, different ones of the memory devices 300M1-300M9 may be programmed to provide different set up and/or hold characteristics for data signals DATA1-DATA9 being written to the respective memory devices. If a plurality of the memory devices 300M1-300M9 are to be programmed to provide a same characteristic (such as a same driver strength), an enabling mode register set enable/disable signal may be applied to the plurality of the memory devices during a same selective mode register set operation.

As shown in FIG. 6A, a memory device 300 according to embodiments of the present invention may include internal clock signal generator 310 having timing control unit 315, command decoder 320, data input/output (I/O) buffer 330, memory cell array 340, address buffer 350, row decoder 360, column decoder 380, and sense amplifier 370. As discussed above, system clock signal CK, command signals CMD, and address signals ADD may be provided over lines of the clock/command/address bus 112 to clock/command/address pins of the memory device 300. The system clock signal CK may be provided over a dedicated line of bus 112 to a dedicated pin of the memory device 300. Command signals CMD such as a chip select (/CS) signal, a row address strobe (/RAS) signal, a column address strobe (/CAS) signal, and a write enable (/WE) signal may be provided over dedicated lines of the bus 112 to dedicated pins of the memory device 300 and to the command decoder 320. Address signals ADD (including column address signals, row address signals, and/or bank address signals) may be provided over address lines of the bus 112 to the address buffer during read and/or write operations. During mode register set operations, however, a mode register set command may be provided over address lines of the bus 112. As discussed above, lines of the address bus 112 may be connected to a plurality of memory devices in a memory module.

Lines of a data bus may be connected only between a memory controller and the memory device 300. More particularly, data signals DATA, a data strobe signal DQS, and a data mask signal DM may be provided over lines of the data bus to respective data input/output, data strobe, and data mask pins during read and/or write operations. The mode register set enable/disable signal ID, for example, may be provided to a dedicated mode register set enable/disable pin of the memory device 300 during a mode register set operation, and the dedicated pin may be non-functional during read and write operations. In an alternative, the mode register set enable/disable signal ID may be provided to one of the data input/output, data strobe, or data mask pins during a mode register set operation.

During a read operation, data is read from memory cells of the memory cell array 340 identified by address signals ADD provided through address buffer 350. More particularly, data from addresses identified by the row decoder 360 and column decoder 380 is read by sense amplifier 370 and provided to the data I/O buffer 330 as internal data signals iDATA. The buffer 330 provides data signals DATA corresponding to internal data signals iDATA, and the data signals DATA are provided in synchronization with the internal clock signal iCLK generated by the internal clock generator 310.

During a write operation, data signals DATA are provided from the memory controller to data input/output pins of the memory device 300 and latched in the data input/output buffer 330 in synchronization with the internal clock signal iCLK. The data signals DATA in the buffer 330 are then provided as internal data signals iDATA to the memory cell array 340. Address signals ADD received at the address buffer 350 through address pins of the memory device 300 define locations of memory cells of the memory cell array 340 to which the internal data signals iDATA are to be written.

A mode register set operation may be initiated by providing command signals CMD corresponding to a mode register set operation. For example, the chip select signal (/CS), the row address strobe signal (/RAS), the column address strobe signal (/CAS), and the write enable signal (/WE) may all be provided as low signals over the clock/command/address bus 112 to the command decoder 320 to initiate a mode register set operation. Once a mode register set operation is initiated, a mode register set command is provided over address lines of the clock/command/address bus 112 to address pins and the address buffer 350. Because a mode register set operation has been initiated, the signals received over the address lines are treated as a mode register set command as opposed to a memory address.

Figure 6B:
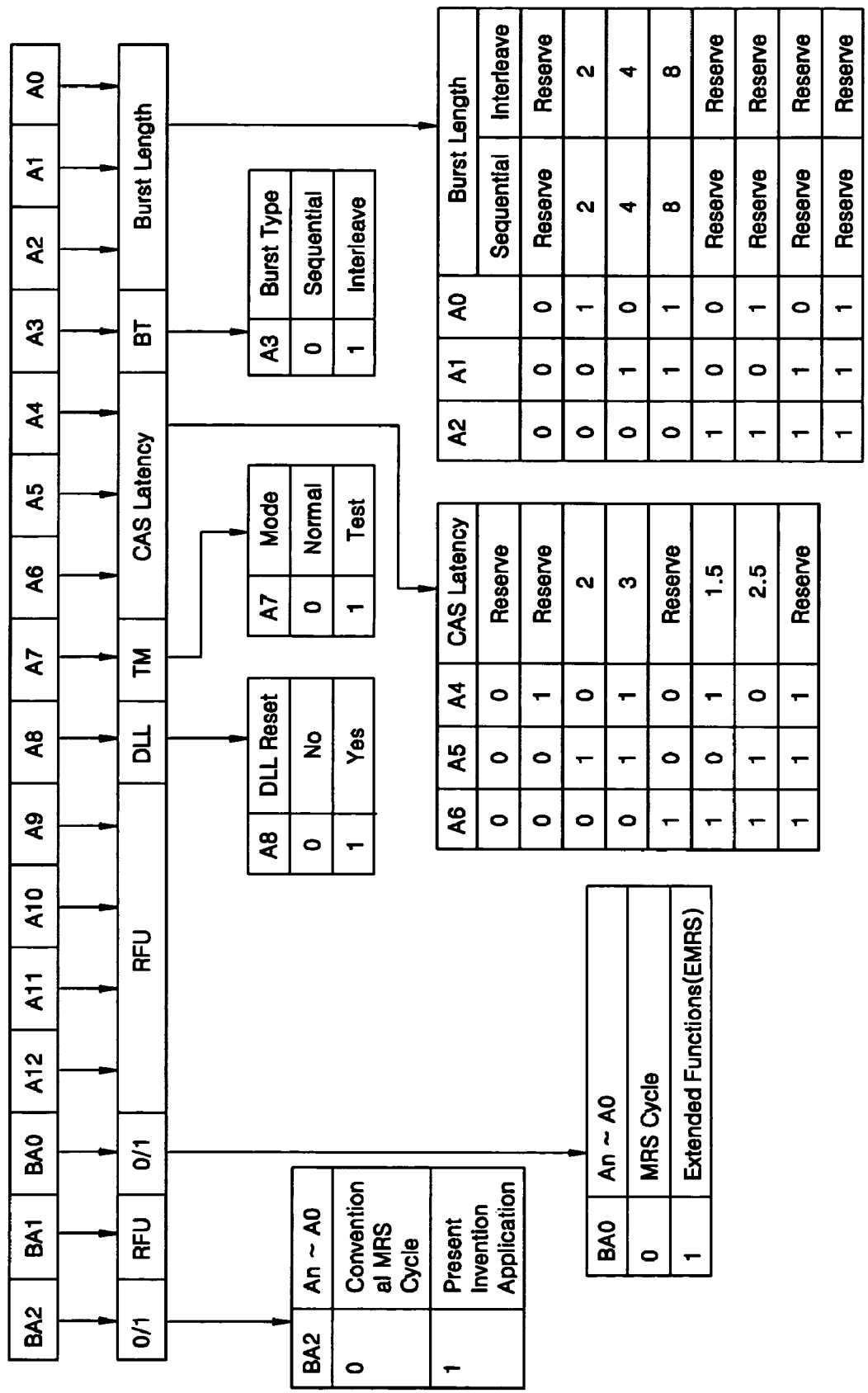
FIG. 6B is a table illustrating mode register set commands according to embodiments of the present invention.

Signals provided to address pins may define various mode register set commands as illustrated in the table of FIG. 6B. Bank address pin BA2, for example, may be used to distinguish a convention mode register set operation (logic value "0") from selective mode register set operations according to embodiments of the present invention where the selective mode register set operation is enabled or disabled depending on the logic value of the mode register set enable/disable signal ID. If a conventional mode register set operation is selected (by providing a logic value of 0 at bank address pin BA2), the bank address pin BA1 may be reserved for future use (RFU), a mode register set (MRS) cycle may be selected by providing a logic value of 0 at bank address pin BA0, and an extended functions mode register set (EMRS) cycle may be selected by providing a logic value of 1 at bank address pin BA0. In an MRS cycle, address pins A9-A12 may be reserved for future use (RFU), address pin A8 may accept a delay locked loop (DLL) reset command, address pin A7 may accept a test mode (TM) command, address pins A4-A6 may accept a CAS latency command, address pin A3 may accept a burst type (BT) command, and address pins A0-A3 may accept a burst length command. Conventional MRS and EMRS cycles may be provided by a memory controller over address lines of a clock/command/address bus 112 to a plurality of memory devices on a memory module. Moreover, the plurality of memory devices connected to the clock/command/address bus 112 may all implement the conventional MRS or EMRS commands provided over the bus.

When a selective mode register set operation according to embodiments of the present invention is performed, the same selective mode register set command may be provided on address lines of a clock/command/address bus to a plurality of memory devices, but the mode register set command may be implemented at some of the memory devices and not others based on the mode register set enable/disable signal ID applied to each of the memory devices. As discussed above, a selective mode register set command according to embodiments of the present invention may be identified by providing a logic value "1" on bank address line BA2.

A mode register set operation according to embodiments of the present invention can be initiated by providing command signals CMD (such as /CS, /RAS, /CAS, and /WE all low) corresponding to a mode register set operation, and providing a logic value "1" at bank address pin BA2. As the command signals and bank address signals may be provided over the clock/command/address bus 112 to all memory devices of a module, all memory devices of the module may receive the command and address signals. Each memory device of the module, however, may receive a mode register set enable/disable signal ID over a different signal line from the memory controller. Moreover, the particular mode register set enable/disable signal ID received at a particular memory device may determine whether the mode register set operation is performed at that device.

When command signals CMD corresponding to a mode register set operation are provided to the command decoder 320 of memory device 300, and address signals ADD including a bank address signal BA2 of logic value 1 are provided to the address buffer 350, the memory device may recognize a selective mode register set operation according to embodiments of the present invention. The memory device 300 determines whether to perform the selective mode register set operation depending on the value of the mode register set enable/disable signal ID provided selectively to the memory device 300 and not provided to other memory devices of the module. If an enabling mode register set enable/disable signal ID is provided to the memory device 300, the selective mode register set operation may be performed in accordance with a mode register set command received over address lines at address buffer 350 according to embodiments of the present invention. More particularly, portions of a mode register set command may be written to a mode register (such as may be provided in the control unit 315) to effect a desired mode of operation. If a disabling mode register set enable/disable signal ID is provided to the memory device 300, the selective mode register set operation may be ignored according to embodiments of the present invention.

Figure 7A:
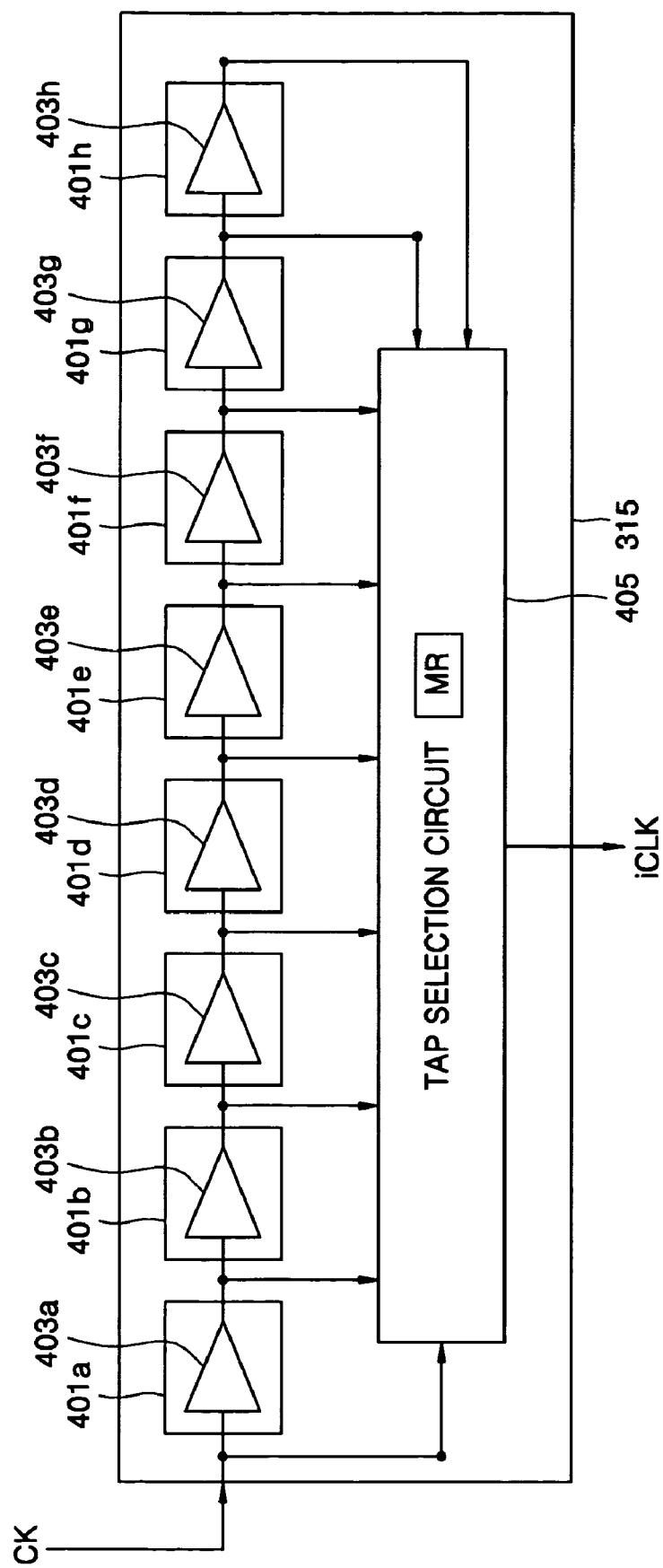
FIG. 7A is a block diagram illustrating internal clock signal control units according to embodiments of the present invention.

The system clock signal CK may be provided as an input to the control unit of FIG. 6A, and the internal clock signal iCLK may be provided as an output of the control unit 315, as shown in FIG. 7A. More particularly, the control unit 315 of FIG. 6A may include a plurality of delay circuits 401a-h, and each delay circuit may include a respective buffer circuit 403a-h. A tap selection circuit 405 may select the input of delay circuit 401a or the output of one of the delay circuits 401a-h to adjust a timing of the internal clock signal iCLK, and the tap selection may be determined responsive to a selective mode register set operation according to embodiments of the present invention. More particularly, a mode register MR provided in the tap selection circuit 405 may be set responsive to a mode register set command received during a selective mode register set operation for that memory device to thereby effect a desired timing of the internal clock signal.

For example, the tap from delay circuit 401d may be arbitrarily selected as a default tap to provide a default timing output. Taps other than the default tap may be selected to advance or retard the internal clock signal relative to the default tap. Accordingly, the tap selection circuit 405 may select a particular tap thereby defining a timing of the internal clock signal iCLK relative to the system clock signal CK. Moreover, the tap selection circuit 405 may select a particular tap responsive to a selective mode register set operation according to embodiments of the present invention. Accordingly, a delay of the internal clock signal iCLK relative to the system clock signal CK may be different for different memory devices of a memory module to compensate for different propagation delays of the system clock signal CK at different memory devices.

Accordingly, a selective mode register set operation may be preformed for the memory device 300 to adjust a timing of the internal clock signal iCLK relative to the system clock signal CK. The selective mode register set operation may be initiated for the memory device 300 by providing command signals CMD corresponding to a mode register set operation, by providing a mode register set command to the address buffer 350, and by providing an enabling mode register set enable/disable signal ID for the memory device 300. The mode register set command may be identified as a selective mode register set command, for example, by providing a logic value "1" to a bank address line BA2 of the clock/command/address bus 112.

With nine different delay taps for the control unit 315, nine different timing commands MRS1-MRS9 may be provided to define the tap to be selected by the tap selection circuit 405 as illustrated, for example, in FIG. 7B. Moreover, a four bit code may be provided over four predetermined address lines of the clock/command/address bus 112 during a selective mode register set operation to define the different timing commands MRS1-MRS9. For example, each of the delay circuits 401a-h may provide an advance/delay T approximately equal to a difference in a propagation delay of a system clock signal CK between adjacent memory devices along a clock/command/address bus 112. With reference to FIGS. 7A and 7B, timing command MRS1 may provide a relative delay +4T of the internal clock signal iCLK by selecting a tap at the output of delay circuit 401h; timing command MRS2 may provide a relative delay +3T of the internal clock signal iCLK by selecting a tap at the output of delay circuit 401g; timing command MRS3 may provide a relative delay +2T of the internal clock signal iCLK by selecting a tap at the output of delay circuit 401f; timing command MRS4 may provide a relative delay +1T of the internal clock signal iCLK by selecting a tap at the output of delay circuit 401e; timing command MRS5 may provide a reference or default (0 advance or delay) for the internal clock signal iCLK by selecting a tap at the output of delay circuit 401d; timing command MRS6 may provide a relative advance −1T of the internal clock signal iCLK by selecting a tap at the output of delay circuit 401c; timing command MRS7 may provide a relative advance −2T of the internal clock signal iCLK by selecting a tap at the output of delay circuit 401b; timing command MRS8 may provide a relative advance −3T of the internal clock signal iCLK by selecting a tap at the output of delay circuit 401a; and timing command MRS9 may provide a relative advance −4T of the internal clock signal iCLK by selecting a tap at the input of delay circuit 401a.

With reference to the memory module 200 and the memory controller 100 of FIG. 5, identical memory devices 300M1-300M9 may be provided on the module 200 with each memory device supporting selective mode register set operations according to embodiments of the present invention to support adjustments of the timing of the internal clocks thereof. The memory controller 100 may proceed with nine selective mode register set operations to define operations of the internal clock signal generators of each memory device. For example, the memory controller 100 may provide selective mode register set commands to adjust internal clock signal timings based on the position of each memory device 300M1-300M9 and assumed propagation delays of the system clock signal CK at each memory device position. In an alternative, the memory controller 100 may provide selective mode register set commands to adjust internal clock timings based on measured performance of individual memory devices of the module 200.

According to particular embodiments of the present invention, the selective mode register set commands MRS1-MRS9 of FIG. 7B may be selectively applied to the respective memory devices 300M1-300M9. In a first selective mode register set operation, the mode register set command MRS1 may be applied to all memory devices 300M1-300M9 along clock/command/address bus 112, an enabling mode register set enable/disable signal ID1 may be applied to memory device 300M1, and disabling mode register set enable/disable signals ID2-ID9 may be applied to memory devices 300M2-300M9. In a second selective mode register set operation, the mode register set command MRS2 may be applied to all memory devices 300M1-300M9 along clock/command/address bus 112, an enabling mode register set enable/disable signal ID2 may be applied to memory device 300M2, and disabling mode register set enable/disable signals ID1 and ID3-ID9 may be applied to memory devices 300M1 and 300M3-300M9. In a third selective mode register set operation, the mode register set command MRS3 may be applied to all memory devices 300M1-300M9 along clock/command/address bus 112, an enabling mode register set enable/disable signal ID3 may be applied to memory device 300M3, and disabling mode register set enable/disable signals ID1-ID2 and ID4-ID9 may be applied to memory devices 300M1-300M2 and 300M4-300M9. In a fourth selective mode register set operation, the mode register set command MRS4 may be applied to all memory devices 300M1-300M9 along clock/command/address bus 112, an enabling mode register set enable/disable signal ID4 may be applied to memory device 300M4, and disabling mode register set enable/disable signals ID1-ID3 and ID5-ID9 may be applied to memory devices 300M1-300M3 and 300M5-300M9.

In a fifth selective mode register set operation, the mode register set command MRS5 may be applied to all memory devices 300M1-300M9 along clock/command/address bus 112, an enabling mode register set enable/disable signal ID5 may be applied to memory device 300M5, and disabling mode register set enable/disable signals ID1-ID4 and ID6-ID9 may be applied to memory devices 300M1-300M4 and 300M6-300M9. In a sixth selective mode register set operation, the mode register set command MRS6 may be applied to all memory devices 300M1-300M9 along clock/command/address bus 112, an enabling mode register set enable/disable signal ID6 may be applied to memory device 300M6, and disabling mode register set enable/disable signals ID1-D5 and ID7-ID9 may be applied to memory devices 300M1-300M5 and 300M7-300M9. In a seventh selective mode register set operation, the mode register set command MRS7 may be applied to all memory devices 300M1-300M9 along clock/command/address bus 112, an enabling mode register set enable/disable signal ID7 may be applied to memory device 300M7, and disabling mode register set enable/disable signals ID1-ID6 and ID8-ID9 may be applied to memory devices 300M1-300M6 and 300M8-300M9. In a eighth selective mode register set operation, the mode register set command MRS8 may be applied to all memory devices 300M1-300M9 along clock/command/address bus 112, an enabling mode register set enable/disable signal ID8 may be applied to memory device 300M8, and disabling mode register set enable/disable signals ID1-ID7 and ID9 may be applied to memory devices 300M1-300M7 and 300M9. In a ninth selective mode register set operation, the mode register set command MRS9 may be applied to all memory devices 300M1-300M9 along clock/command/address bus 112, an enabling mode register set enable/disable signal ID9 may be applied to memory device 300M9, and disabling mode register set enable/disable signals ID1-ID8 may be applied to memory devices 300M1-300M8.

Figure 8:
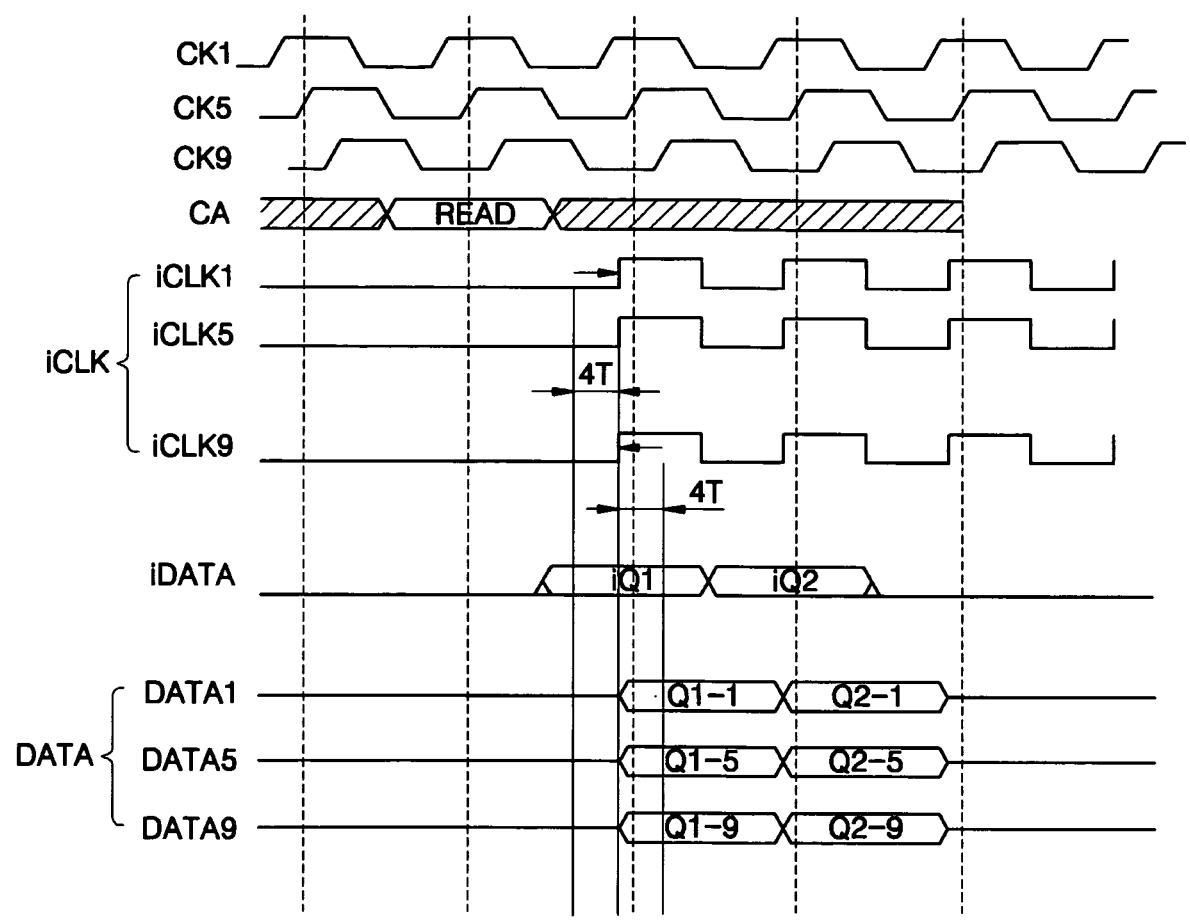
FIG. 8 is a timing diagram illustrating internal clock signal timing during read operations according to embodiments of the present invention.
Figure 9:
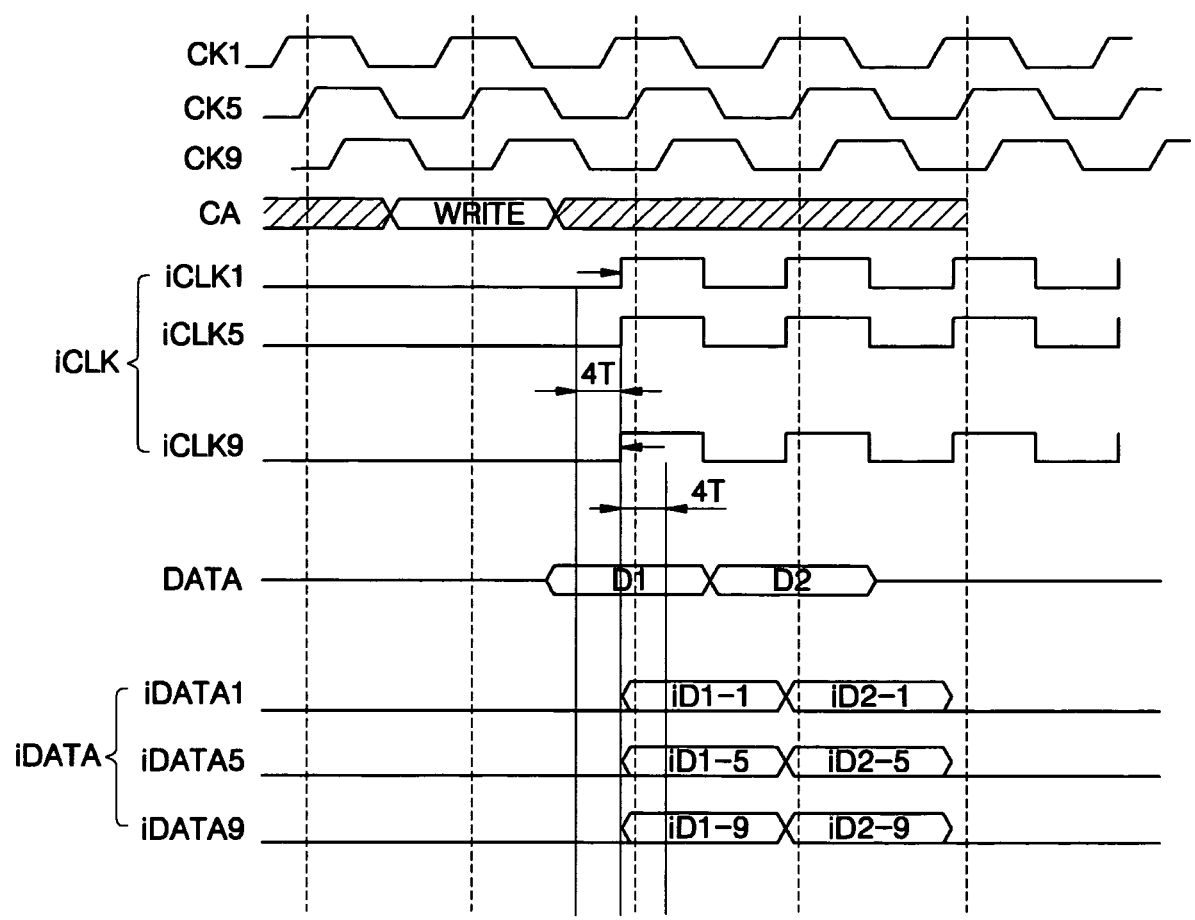
FIG. 9 is a timing diagram illustrating internal clock signal timing during write operations according to embodiments of the present invention.

As illustrated in the timing diagrams of FIGS. 8 and 9, the selective mode register set operations discussed above may provide an approximate synchronization of internals clock signals iCLK for different memory devices 300M1-300M9 of the memory module 200 illustrated in FIG. 5. During a read operation illustrated in FIG. 8, transitions of the system clock signal CK are received by different memory devices of the memory module at different times due to different propagation delays along the clock/command/address bus 112. More particularly, a rising edge of the system clock-signal may be received at memory device 300M1 before it is received at memory device 300M5 as shown by signals CK1 and CK5, and a rising edge of the system clock signal may be received at memory device 300M5 before it is received at memory device 300M9 as shown by signals CK5 and CK9. Because timings of the internal clock signals of the memory devices have been selectively adjusted using selective mode register set operations, the internal clock signals iCLK1, iCLK5, and iCLK9 may be approximately synchronized. More particularly, a delay of the internal clock signal iCLK1 can be increased relative to the clock signal CK1 received at the first memory device 300M1, a default delay of the internal clock signal iCLK5 can be maintained relative to the clock signal CK5 received at the fifth memory device 300M5, and a delay of the internal clock signal iCLK9 can be reduced relative to the clock signal CK9 received at the memory device 300M9.

Accordingly, a timing for latching internal data iDATA for each memory device 300M1-300M9 into the respective input/output buffers may be determined with respect to the approximately synchronized internal clock signals iCLK1-9. A timing for providing the data signals DATA1-DATA9 to the memory controller 100 over respective data buses may thus also be approximately synchronized. Accordingly, the data signals DATA1-DATA9 may be provided on the respective data buses at approximately the same time during a data read operation, and data skew may thus be reduced.

During a write operation illustrated in FIG. 9, transitions of the system clock signal CK are received by different memory devices of the memory module at different times due to different propagation delays along the clock/command/address bus 112. As discussed above, internal clock signals iCLK1-iCLK9 may be approximately synchronized. Accordingly, a timing for latching data signals DATA from the memory controller for each memory device 300M1-300M9 into the respective input/output buffers may be determined with respect to the approximately synchronized internal clock signals iCLK1-9. A timing for providing the internal data iDATA1-iDATA9 from the input/output buffers to the memory cell array 340 over respective data buses may thus also be approximately synchronized. Accordingly, the data signals DATA1-DATA9 may be received into the respective input/output buffers of the memory devices of a module at approximately the same time during a data write operation, and data skew may thus be reduced.

In a memory module 200 including a plurality of memory devices 300M1-300Mn, a mode register set command may be provided over a clock/command/address bus 112 that is coupled to all of the memory devices 300M1-300Mn. Mode register set enable/disable signals ID1-IDn, however, may be separately provided between the memory controller 100 and the respective memory devices 300M1-300Mn. As discussed above, a bit of a mode register set command may identify a selective mode register set command according to embodiments of the present invention, an enabling mode register set enable/disable signal(s) may identify a respective memory device(s) to which the selective mode register set command is to be applied, and a disabling mode register set enable/disable signal(s) may identify a respective memory device(s) for which the selective mode register set command is not to be applied. If only mode register set enable/disable signal ID1 is enabling and mode register set enable/disable signals ID2-IDn are disabling, the selective mode register set command is only applied to memory device 300M1. In an alternative, enabling mode register set enable/disable signals may be applied to a plurality of memory devices during a selective mode register set operation so that the selective mode register set operation is applied to the plurality of the enabled memory devices at the same time. A selective mode register set operation according to embodiments of the present invention may thus be applied to one memory device of the module, a plurality of memory devices of the module, or all of the memory devices of the module.

As discussed above, a mode register MR according to embodiments of the present invention may be considered a portion of internal clock generator 310 and more particularly as a portion of tap selection circuit 405. In alternatives, a mode register according to embodiments of the present invention may be considered a portion of command decoder 320, address buffer 350, data I/O buffer 330, and/or other portions of the memory device 300. As further discussed above, the mode register MR may store information corresponding to a selective mode register set command defining an operational characteristic (such as internal clock signal advance/delay) for the memory device. Moreover, a single selective mode register set command may be used to set a plurality of operational characteristics (such as internal clock signal advance/delay, output driver strength, data input set up time, and/or data input hold time) for the memory device. According, a single mode register according to embodiments of the present invention may store information corresponding to a selective mode register set command defining a plurality of operational characteristics for the memory device. In an alternative, a plurality of mode registers may be provided for different operational characteristics set using a single selective mode register set command.

Figure 10:
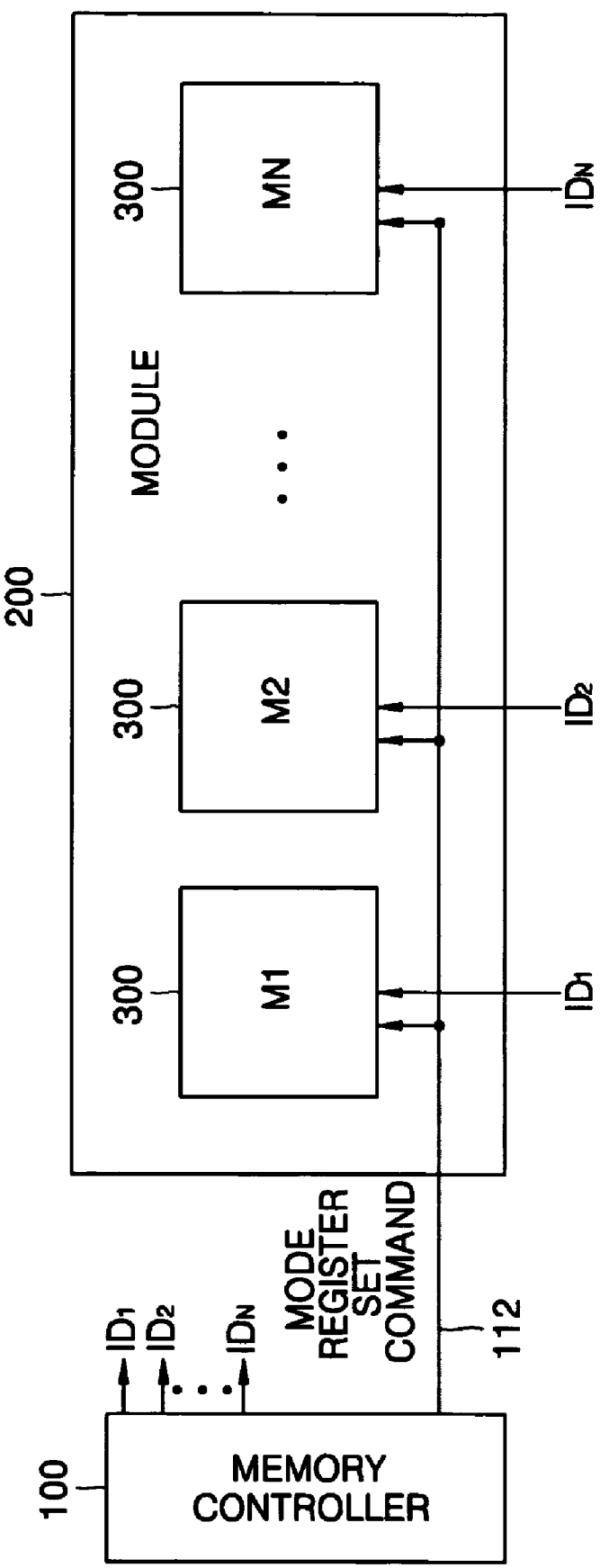
FIG. 10 is a block diagram illustrating couplings of mode register set commands and mode register set enable/disable signals according to embodiments of the present invention.
Figure 11:
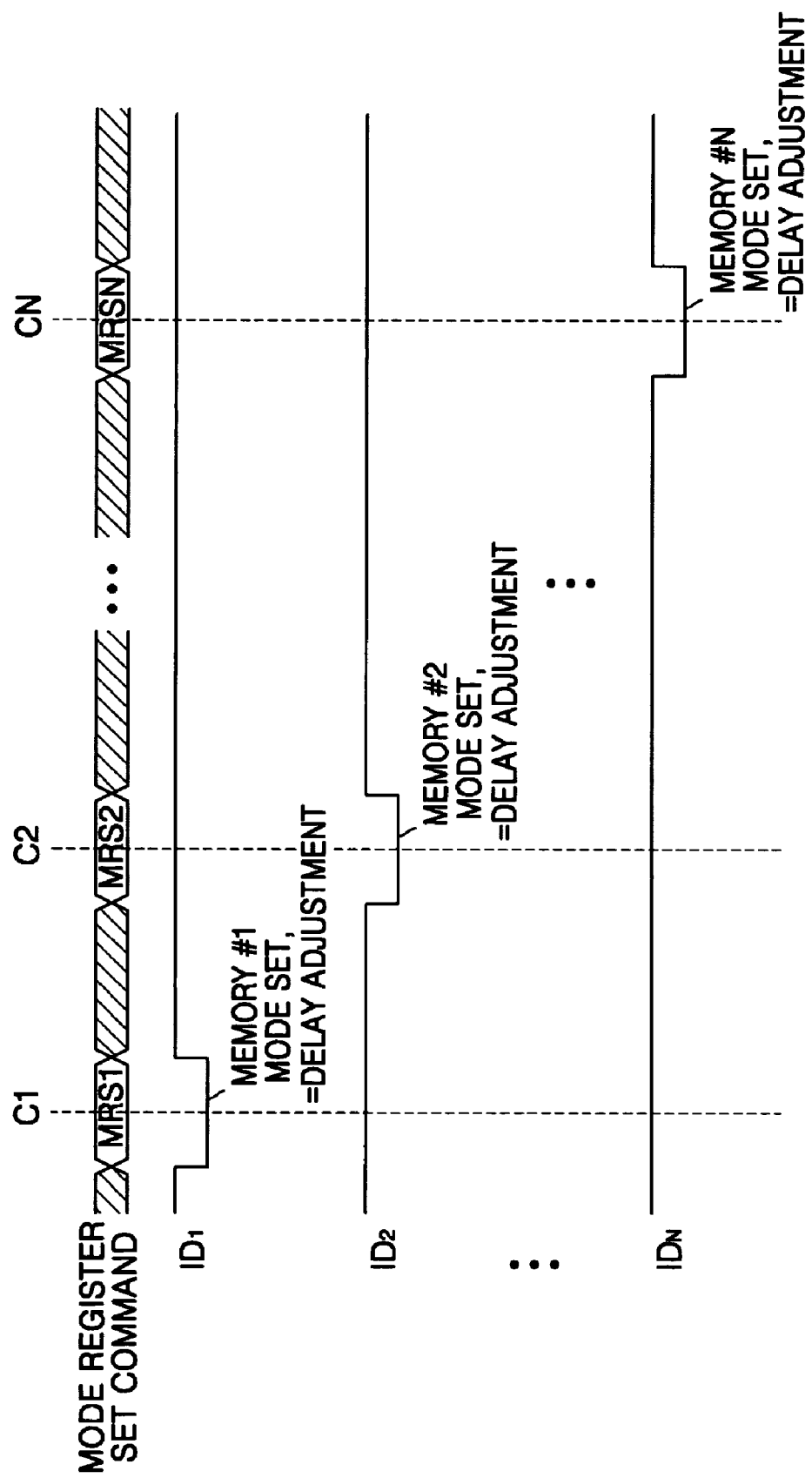
FIG. 11 is a timing diagram illustrating mode register set operations performed using dedicated lines and pins for mode register set enable/disable signals according to embodiments of the present invention.

The timing diagram of FIG. 11 illustrates selective mode register set operations for the memory devices 300M1-300Mn of FIG. 10. In the example of FIG. 11, the mode register set enable/disable signals ID1-IDn are provided over dedicated mode register set enable/disable lines to dedicated mode register set enable/disable pins of the respective memory devices 300M1-300Mn. Stated in other words, the dedicated mode register set enable/disable lines and pins are non-functional during data read and/or write operations.

As shown in FIG. 11, a first mode register set command MRS1 may be applied over the clock/command/address bus 112, an enabling mode register set enable/disable signal ID1 (logic level 0) may be applied to the first memory device 300M1, and disabling mode register set enable/disable signals ID2-IDn (logic level 1) may be applied to the memory devices 300M2-300Mn during a first mode register set operation C1. Accordingly, the first mode register set operation C1 may provide delay adjustment for an internal clock signal iCLK1 of memory device 300M1.

During a second mode register set operation C2, a second mode register set command MRS2 may be applied over the clock/command/address bus 112, an enabling mode register set enable/disable signal ID2 (logic level 0) may be applied to the second memory device 300M2, and disabling mode register set enable/disable signals ID1 and ID3-IDn (logic level 1) may be applied to the memory devices 300M1 and 300M3-300Mn. Accordingly, the second mode register set operation C2 may provide delay adjustment for an internal clock signal iCLK2 of memory device 300M2.

During an $n^{th}$ mode register set operation Cn, an $n^{th}$ mode register set command MRSn may be applied over the clock/command/address bus 112, an enabling mode register set enable/disable signal IDn (logic level 0) may be applied to the $n^{th}$ memory device 300Mn, and disabling mode register set enable/disable signals ID1-ID(n−1) (logic level 1) may be applied to the memory devices 300M1-300M(n−1). Accordingly, the $n^{th}$ mode register set operation Cn may provide delay adjustment for an internal clock signal iCLKn of memory device 300Mn.

The separate mode register set operations may provide different internal clock timing adjustments for different memory devices in a memory module. In addition or in an alternative, separate mode register set operations may provide different driver strengths for different memory devices, different set-up and/or hold times for different memory devices, and/or other characteristics that may vary by memory devices of a same memory module.

Figure 12:
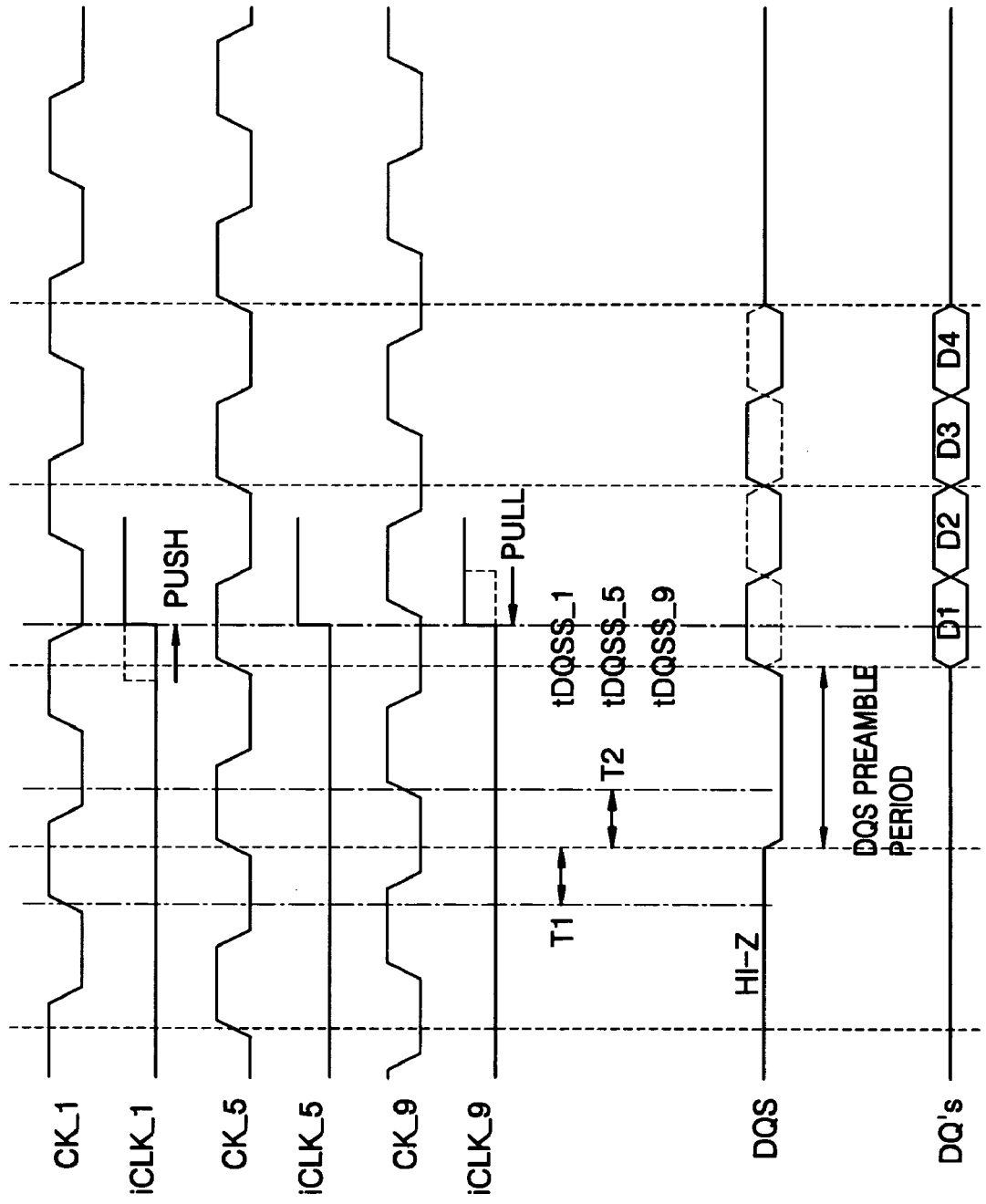
FIG. 12 is a timing diagram illustrating data strobe and internal clock signal operations according to embodiments of the present invention.

FIG. 12 is a timing diagram illustrating a write operation of the memory module 200 including memory devices 300M1-300M9 during a write operation. As shown, a transition of the system clock signal may be received at the first memory device 300M1 before the fifth memory device 300M5 as shown by signals CK1 and Ck5, and the transition of the system clock signal may be received at the fifth memory device 300M5 before the ninth memory device 300M9 as shown by signals CK5 and CK9. As discussed above, selective mode register set operations may provide adjustment of the internal clock signals iCLK1-iCLK9 so that the internal clock signals are approximately synchronized.

During the write operation, the data strobe signals DQS for each memory device transition from a high-impedance state (Hi-Z) to a logic low state, and the data strobe signals are maintained at the low state for the DQS preamble period before the data signals DATA are set up on the respective data buses. Subsequent transitions of the data strobe signals may signal provision of new data D1-D4 for each of the memory devices on the respective data buses. Accordingly, a skew between the transition of the from the Hi-Z state to the low impedance state and a rising edge of the system clock signal received at each of the memory devices may limit high frequency memory operations. By approximately synchronizing internal clock signals of the different memory devices, the data strobe signals may be approximately synchronized with respect to the internal clock signals of the different memory devices so that a frequency of operation may be increased.

Figure 13:
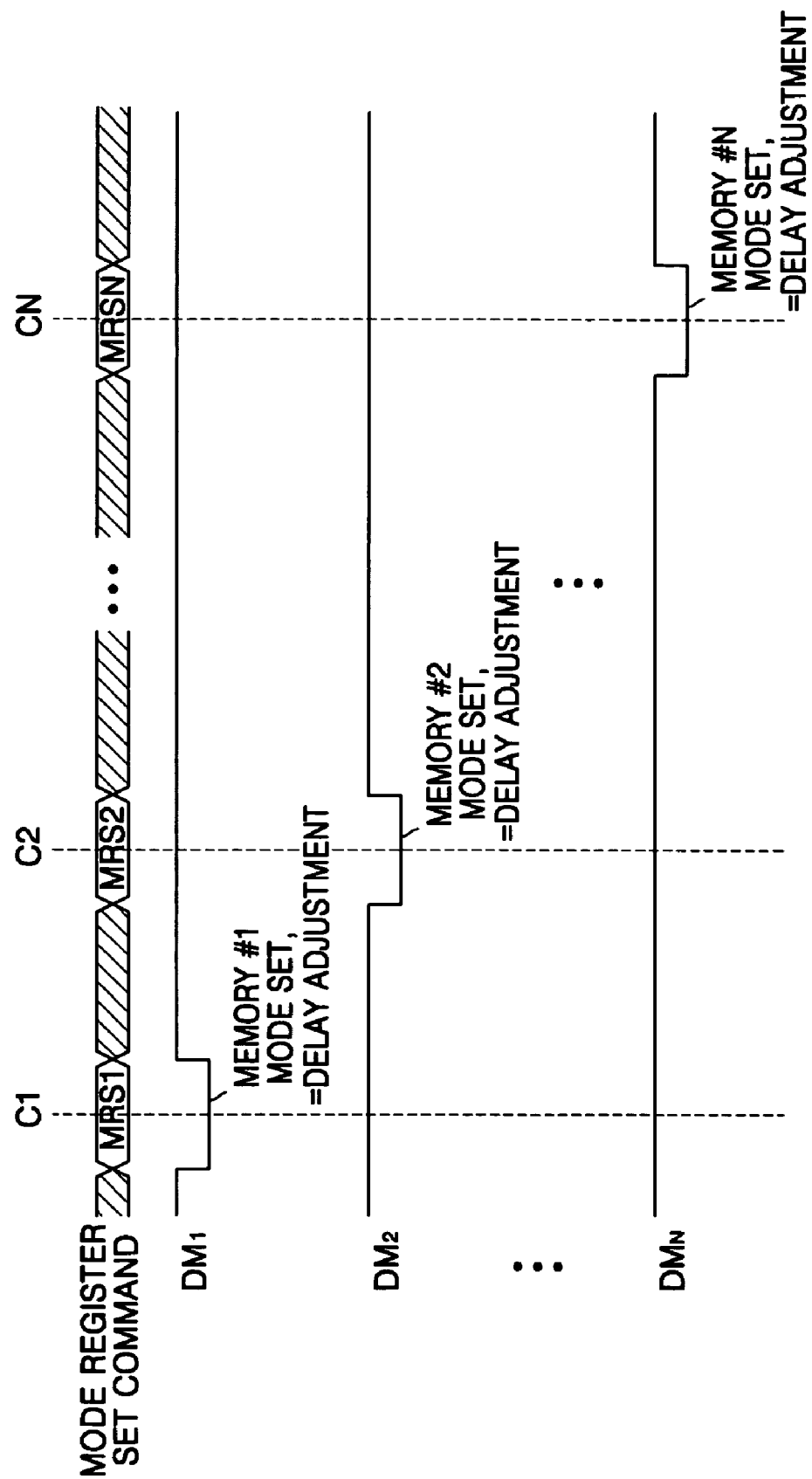
FIG. 13 is a timing diagram illustrating mode register set operations performed using data mask lines and pins for mode register set enable/disable signals according to embodiments of the present invention.

The timing diagram of FIG. 13 illustrates selective mode register set operations for each of the memory devices 300M1-300Mn of FIG. 10. In the example of FIG. 13, the mode register set enable/disable signals ID1-IDn are provided over data mask lines to data mask pins of the respective memory devices 300M1-300M9 during selective mode register set operations. During read and/or write operations, the data mask lines and pins are used to provide data mask signals to the respective memory devices. Because the mode register set enable/disable signals ID1-ID9 are provided over data mask lines and pins, the mode register set enable/disable signals are labeled DM1-DMn in FIG. 13.

As shown in FIG. 13, a first selective mode register set command MRS1 may be applied over the clock/command/address bus 112, an enabling mode register set enable/disable signal ID1 may be applied as DM1 to the first memory device 300M1, and disabling mode register set enable/disable signals ID2-IDn may be applied as DM2-DMn to the memory devices 300M2-300Mn during a first selective mode register set operation C1. Accordingly, the first mode register set operation C1 may provide delay adjustment for an internal clock signal iCLK1 of memory device 300M1.

During a second selective mode register set operation C2, a second selective mode register set command MRS2 may be applied over the clock/command/address bus 112, an enabling mode register set enable/disable signal ID2 may be applied as DM2 to the second memory device 300M2, and disabling mode register set enable/disable signals ID1 and ID3-IDn may be applied as DM1 and DM3-DMn to the memory devices 300M1 and 300M3-300Mn. Accordingly, the second selective mode register set operation C2 may provide delay adjustment for an internal clock signal iCLK2 of memory device 300M2.

During an $n^{th}$ selective mode register set operation Cn, an $n^{th}$ selective mode register set command MRSn may be applied over the clock/command/address bus 112, an enabling mode register set enable/disable signal IDn may be applied as DMn to the $n^{th}$ memory device 300Mn, and disabling mode register set enable/disable signals ID1-ID(n−1) may be applied as DM1-DM(n−1) to the memory devices 300M1-300M(n−1). Accordingly, the $n^{th}$ selective mode register set operation Cn may provide delay adjustment for an internal clock signal iCLKn of memory device 300Mn.

According to embodiments illustrated in FIG. 13, additional dedicated mode register set enable/disable lines and pins are not required because existing data mask lines and pins are used. Selective mode register set operations according to embodiments of the present invention can thus be provided without increasing a pin count of memory devices supporting the selective mode register set operations.

Figure 14:
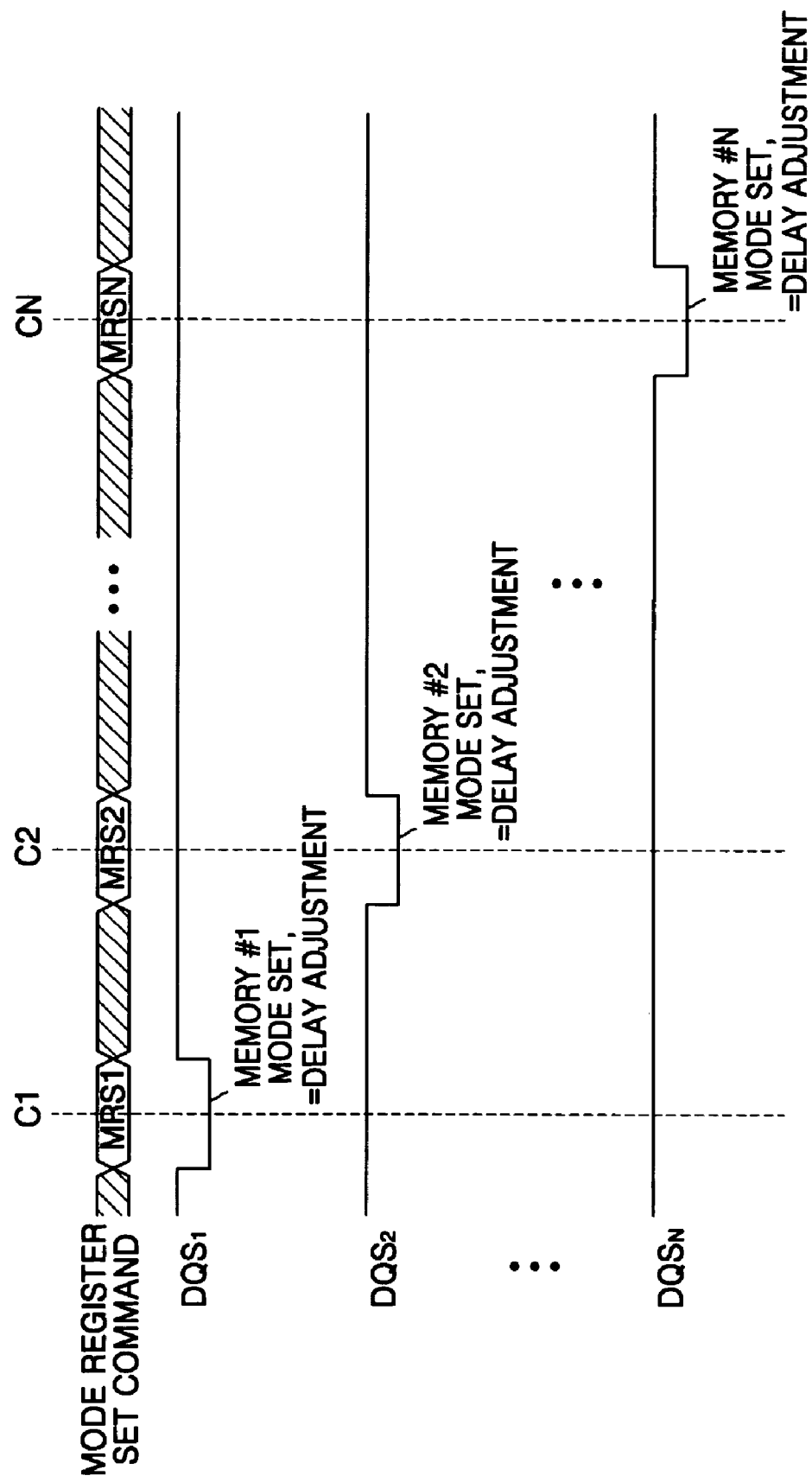
FIG. 14 is a timing diagram illustrating mode register set operations performed using data strobe lines and pins for mode register set enable/disable signals according to embodiments of the present invention.

The timing diagram of FIG. 14 illustrates selective mode register set operations for each of the memory devices 300M1-300Mn of FIG. 10. In the example of FIG. 14, the mode register set enable/disable signals ID1-IDn are provided over data strobe lines to data strobe pins of the respective memory devices 300M1-300M9 during selective mode register set operations. During read and/or write operations, the data strobe lines and pins are used to provide data strobe signals to the respective memory devices. Because the mode register set enable/disable signals ID1-D9 are provided over data strobe lines and pins, the mode register set enable/disable signals are labeled DQS1-DQSn in FIG. 14.

As shown in FIG. 14, a first mode register set command MRS1 may be applied over the clock/command/address bus 112, an enabling mode register set enable/disable signal ID1 may be applied as DQS1 to the first memory device 300M1, and disabling mode register set enable/disable signals ID2-IDn may be applied as DQS2-DQSn to the memory devices 300M2-300Mn during a first mode register set operation C1. Accordingly, the first mode register set operation C1 may provide delay adjustment for an internal clock signal iCLK1 of memory device 300M1.

During a second mode register set operation C2, a second mode register set command MRS2 may be applied over the clock/command/address bus 112, an enabling mode register set enable/disable signal ID2 may be applied as DQS2 to the second memory device 300M2, and disabling mode register set enable/disable signals ID1 and ID3-IDn may be applied as DQS1 and DQS3-DQSn to the memory devices 300M1 and 300M3-300Mn. Accordingly, the first mode register set operation C2 may provide delay adjustment for an internal clock signal iCLK2 of memory device 300M2.

During an $n^{th}$ mode register set operation Cn, an $n^{th}$ mode register set command MRSn may be applied over the clock/command/address bus 112, an enabling mode register set enable/disable signal IDn may be applied as DQSn to the $n^{th}$ memory device 300Mn, and disabling mode register set enable/disable signals ID1-ID(n−1) may be applied as DQS1-DQS(n−1) to the memory devices 300M1-300M(n−1). Accordingly, the $n^{th}$ mode register set operation Cn may provide delay adjustment for an internal clock signal iCLKn of memory device 300Mn.

According to embodiments illustrated in FIG. 14, additional dedicated mode register set enable/disable lines and pins are not required because existing data strobe lines and pins are used. Selective mode register set operations according to embodiments of the present invention can thus be provided without increasing a pin count of memory devices supporting the selective mode register set operations.

Figure 15:
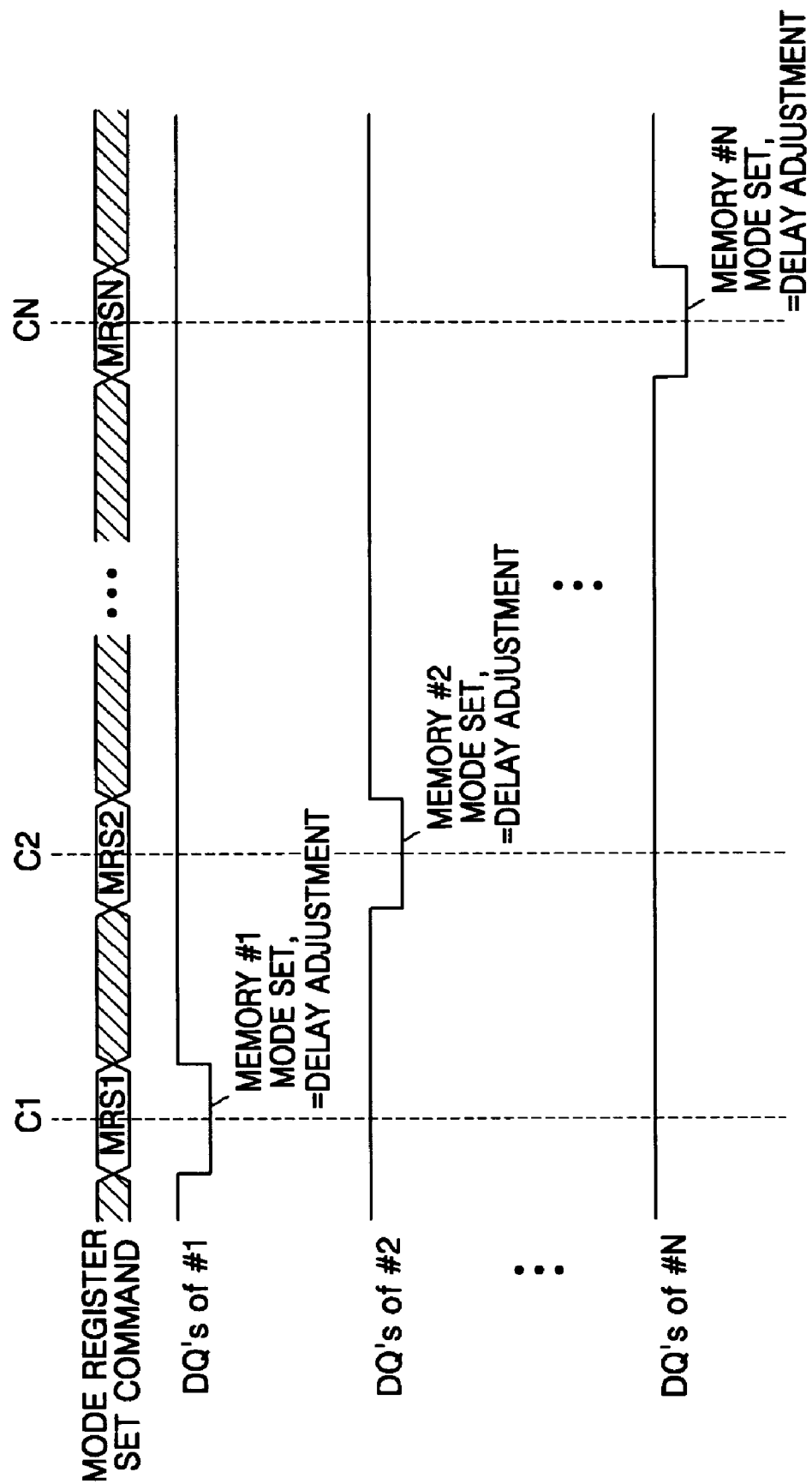
FIG. 15 is a timing diagram illustrating mode register set operations performed using data signal lines and pins for mode register set enable/disable signals according to embodiments of the present invention.

The timing diagram of FIG. 15 illustrates selective mode register set operations for each of the memory devices 300M1-300Mn of FIG. 10. In the example of FIG. 15, the mode register set enable/disable signals ID1-IDn are provided over data signal lines to data signal pins of the respective memory devices 300M1-300M9 during selective mode register set operations. During read and/or write operations, the data signal lines and pins are used to transmit data being read from and written to the respective memory devices. Because the mode register set enable/disable signals ID1-ID9 are provided over data signal lines and pins, the mode register set enable/disable signals are labeled DQ1-DQn in FIG. 15. A plurality of data signal pins may be provided on each memory device, but a single one of the data signal pins on each memory device may be used during selective mode register set operations to receive a mode register set enable/disable signal.

As shown in FIG. 15, a first mode register set command MRS1 may be applied over the clock/command/address bus 112, an enabling mode register set enable/disable signal ID1 may be applied as DQ1 to the first memory device 300M1, and disabling mode register set enable/disable signals ID2-IDn may be applied as DQ2-DQn to the memory devices 300M2-300Mn during a first mode register set operation C1. Accordingly, the first mode register set operation C1 may provide delay adjustment for an internal clock signal iCLK1 of memory device 300M1.

During a second mode register set operation C2, a second mode register set command MRS2 may be applied over the clock/command/address bus 112, an enabling mode register set enable/disable signal ID2 may be applied as DQ2 to the second memory device 300M2, and disabling mode register set enable/disable signals ID1 and ID3-IDn may be applied as DQS1 and DQ3-DQn to the memory devices 300M1 and 300M3-300Mn. Accordingly, the first mode register set operation C2 may provide delay adjustment for an internal clock signal iCLK2 of memory device 300M2.

During an $n^{th}$ mode register set operation Cn, an $n^{th}$ mode register set command MRSn may be applied over the clock/command/address bus 112, an enabling mode register set enable/disable signal IDn may be applied as DQn to the $n^{th}$ memory device 300Mn, and disabling mode register set enable/disable signals ID1-ID(n−1) may be applied as DQ1-DQ(n−1) to the memory devices 300M1-300M(n−1). Accordingly, the $n^{th}$ mode register set operation Cn may provide delay adjustment for an internal clock signal iCLKn of memory device 300Mn.

According to embodiments illustrated in FIG. 15, additional dedicated mode register set enable/disable lines and pins are not required because existing data strobe lines and pins are used. Selective mode register set operations according to embodiments of the present invention can thus be provided without increasing a pin count of memory devices supporting the selective mode register set operations.

As discussed above, selective mode register set operations according to embodiments of the present invention may be used to selectively adjust timings of internal clock signals of different memory devices sharing a same clock/command/address bus. In addition or in an alternative, selective mode register set operations according to embodiments of the present invention may be used to selective set, adjust, and/or change operational characteristics of memory devices sharing a same clock/command/address bus other than internal clock signal timing.

Figure 16:
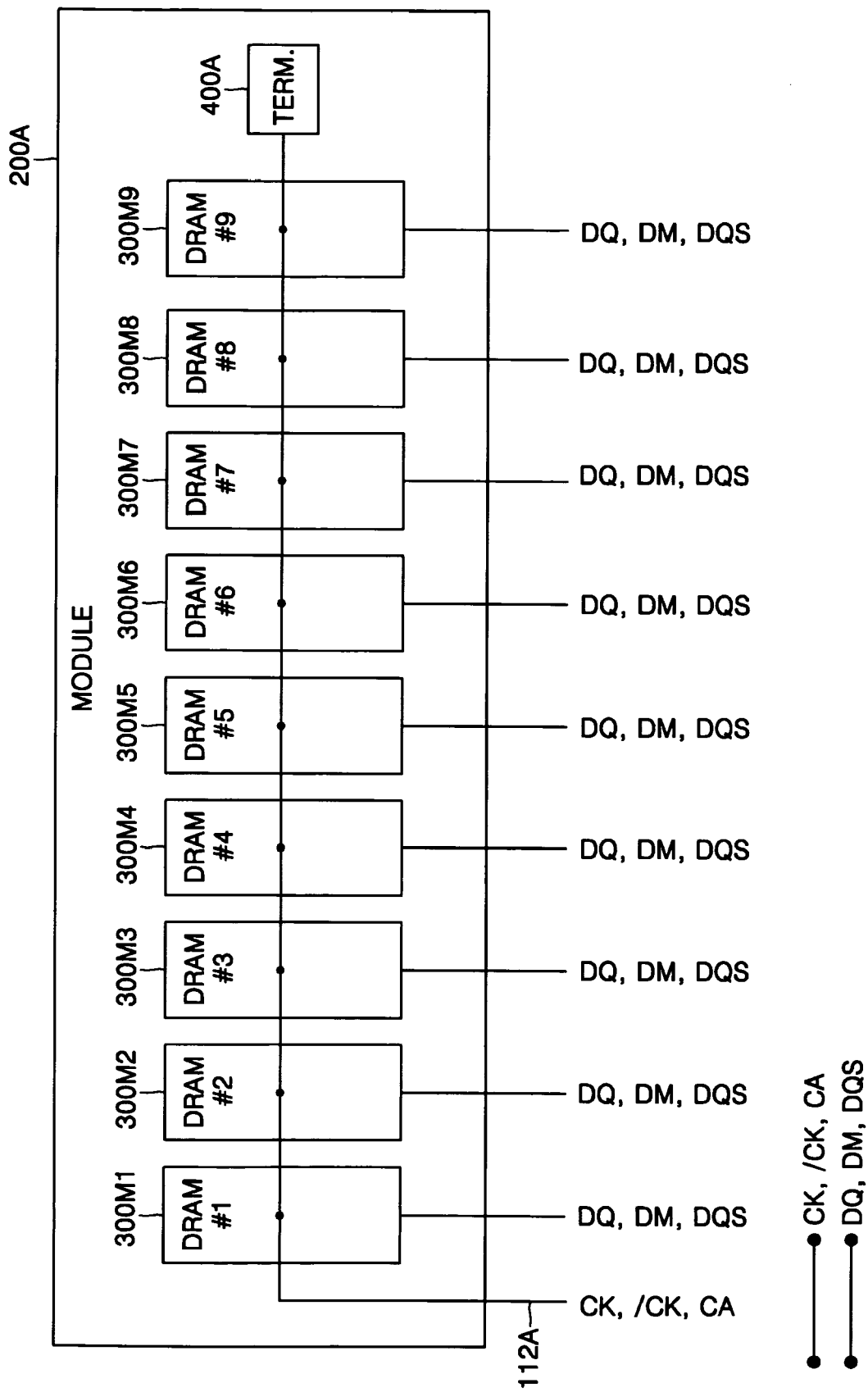
FIG. 16 is a block diagram illustrating topologies for memory modules according to embodiments of the present invention.

In addition, layouts of memory modules other than those illustrated in FIG. 5 may be provided according to embodiments of the present invention. As shown in FIG. 16, the clock/command/address bus 112A may enter the memory module 200A at a first end of a row of memory devices 300M1-300M9, and terminations 400A may be provided for the lines of the bus 112 at a second end of the row of memory devices. More particularly, the terminations may include resisters coupled between ends of respective lines and a reference voltage (such as a supply voltage Vcc). By providing the terminations 400A, a quality of clock, command, and/or address signals provided along lines of the clock/command/address bus 112 may be improved.

Figure 17:
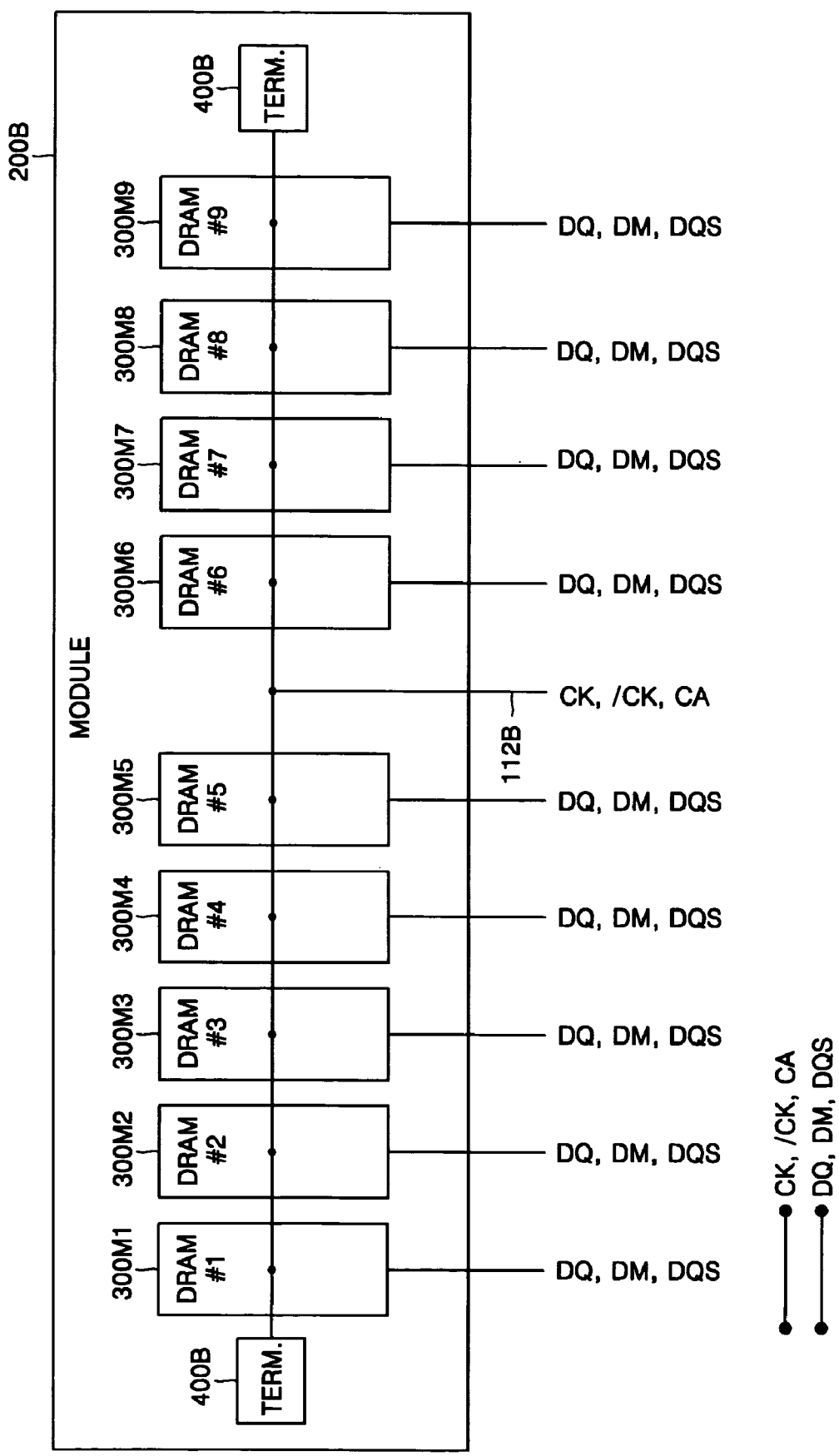
FIG. 17 is a block diagram illustrating additional topologies for memory modules according to embodiments of the present invention.

As shown in FIG. 17, a clock/command/address bus 112B may enter the memory module 200B between memory devices in the row of memory devices 300M1-300M9, and the bus 112 may extend in opposite directions. Moreover, terminations 400B may be provided for the bus 112 at opposite ends of the row of memory devices 300M1-300M9. Each line of the bus 112 may thus be terminated using a pair of resistors, with a first resistor of the pair terminating the line at a first end of the row of memory devices and with a second resistor of the pair terminating the line at a second end of the row of memory devices. By providing that the bus is fed from approximately a center of the row of memory devices, a skew of the system clock signal received at different memory devices in the row can be reduced. In the example of FIG. 5, a transition of the system clock signal may be received at memory device 300M9 a period of time 8T after the transition is received is received at memory device 300M1. Assuming an additional propagation delay of T for each memory device along the bus 112B of FIG. 17, a transition of the system clock signal may be received at memory device 300M1 a period of time 4T after the transition is received at memory device 300M5. Accordingly, a maximum skew of the system clock signal received at different memory devices of module 200B may be reduced by a factor of approximately 2.

Figure 18:
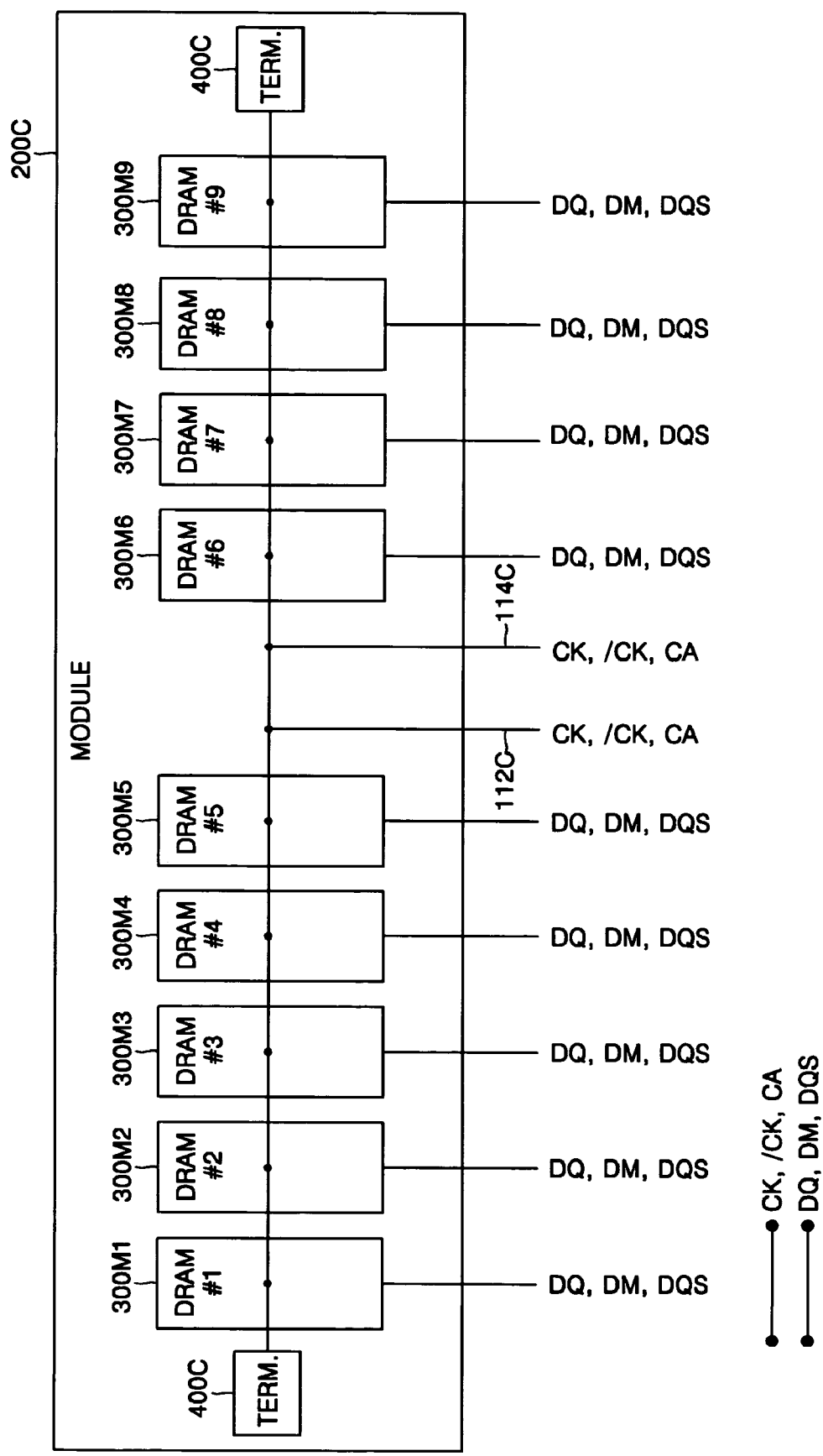
FIG. 18 is a block diagram illustrating yet additional topologies for memory modules according to embodiments of the present invention.

As shown in FIG. 18, separate clock/command/address buses 112C and 114C may be provided for different groups of the memory devices in a row of the memory module 200C. For example, memory devices 300M1-300M5 may be provided along bus 112c, and memory devices 300M6-300M9 may be provided along bus 114C. Moreover, terminations 400C may be provided at ends of each of the buses 112C and 114C. While shown with the buses 112c and 114C entering at a middle of the row of memory devices with terminations 400C at ends of the row of memory devices, the buses 112C and 114C may enter at opposite ends of the row of memory devices with terminations being provided at a middle of the row of memory devices. A maximum skew of a transition of the system clock signal received at different memory devices can thus be reduced as discussed above with respect to FIG. 17.

By providing separate buses 112C and 114C, selective mode register set operations according to embodiments of the present invention may be performed for different memory devices of the module 200C at the same time. If a separate selective mode register set operation is performed for each of the memory devices 300M1-300M9, for example, five sequential mode register set operations for memory devices 300M1-300M5 may be performed in parallel with four sequential mode register set operations for memory devices 300M6-300M9. A time required to perform separate selective mode register set operations from nine memory devices using two separate clock/command/address buses can thus be reduced as compared with performing nine sequential mode register set operations using a single clock/command/address bus.

Figure 19:
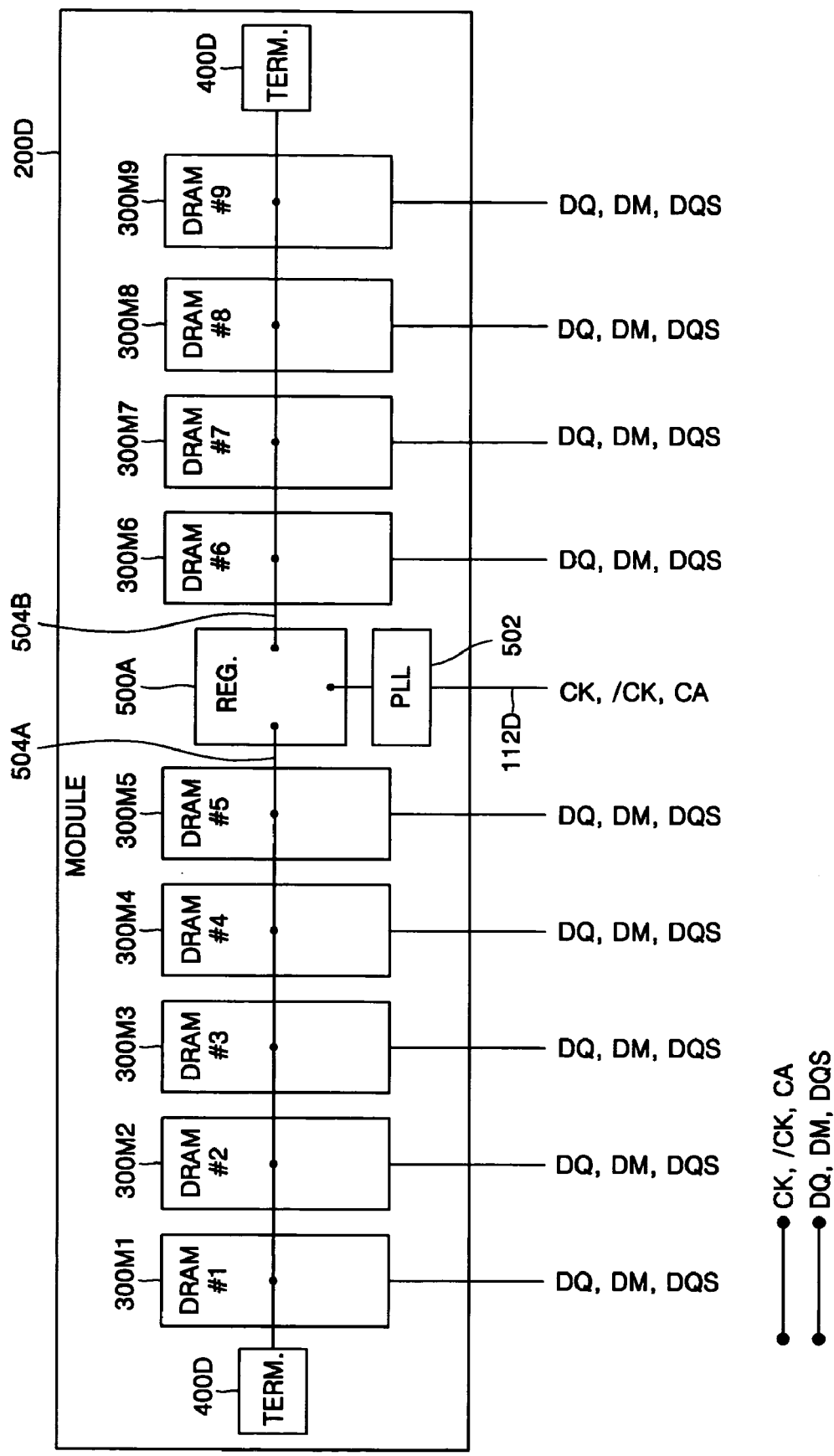
FIG. 19 is a block diagram illustrating still additional topologies for memory modules according to embodiments of the present invention.

As shown in FIG. 19, a clock/command/address bus 112D from a memory controller may feed a register 500A providing separately buffered clock/command/address signals on buses 504A and 504B. A phase-locked-loop (PLL) circuit 502 may be provided to improve a system clock signal received from a memory controller, and terminations 400D may be provided at ends of the buses 504A-B. By providing separate buses 504A-B both fed from the register 500A, a maximum skew of a transition of a system clock signal received at different memory devices can be reduced. As shown, the register 500A and the phase-locked-loop circuit 502 may be provided together. In alternatives, the register 500A may be provided without the phase-locked-loop circuit 502, or the phase-locked-loop circuit may be provided without the register 500A.

Figure 20:
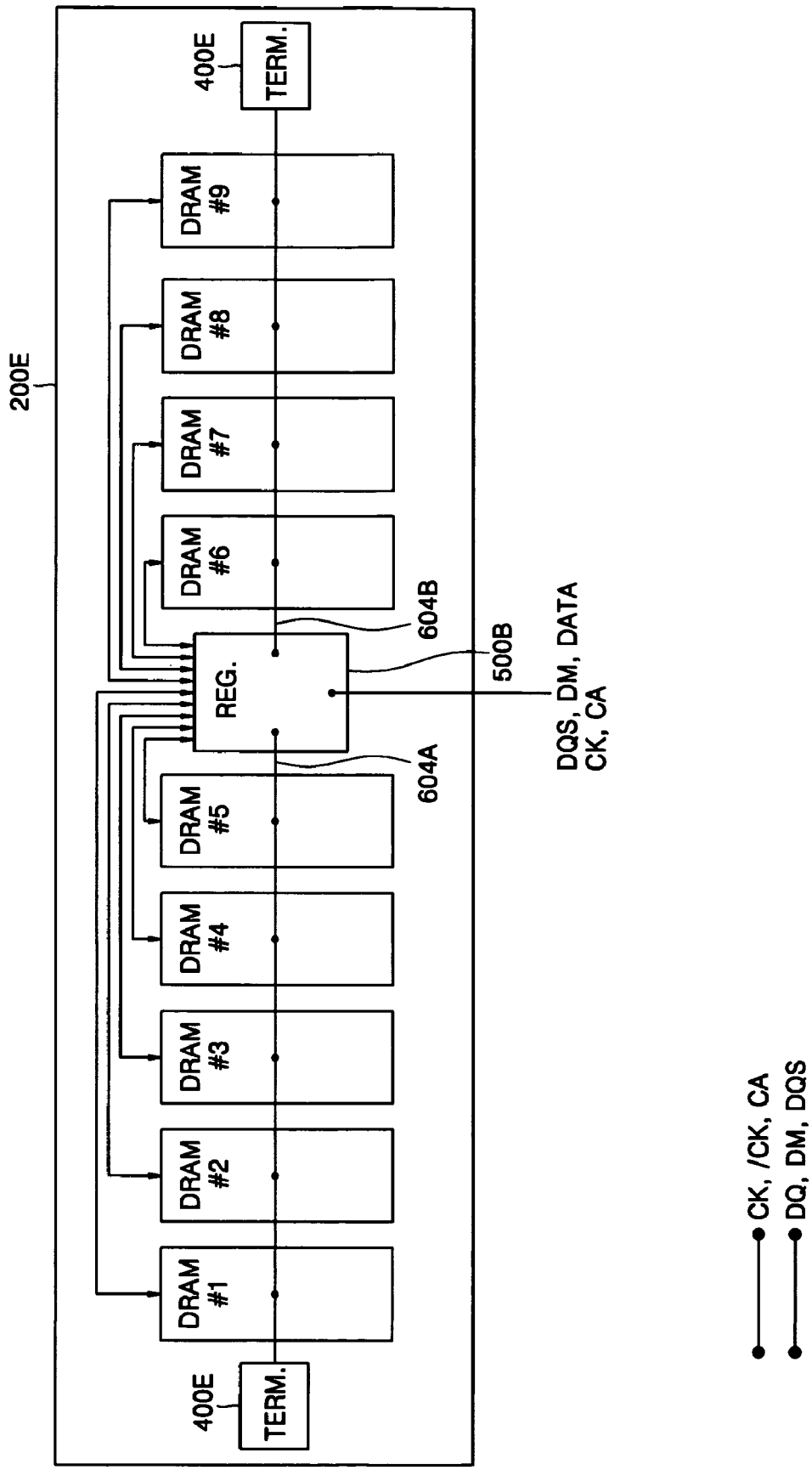
FIG. 20 is a block diagram illustrating more topologies for memory modules according to embodiments of the present invention.

As shown in FIG. 20, clock/command/address signals and data signals for all of the memory devices of memory module 200F may be provided from a memory controller to register 500B, and the clock/command/address signals may be separately buffered and provided on buses 604A-B as discussed above with respect to FIG. 19. In addition, the register 500B may provide separate data signals DATA, separate data mask signals DM, and separate data strobe signals DQS over separate buses to each of the memory devices 300M1-300M9. Moreover, terminations 400E may be provided for each of the buses 604A-B. While not shown in FIG. 20, a phase-locked-loop (PLL) circuit may be provided for the system clock signal as discussed above with respect to FIG. 19.

Figure 21:
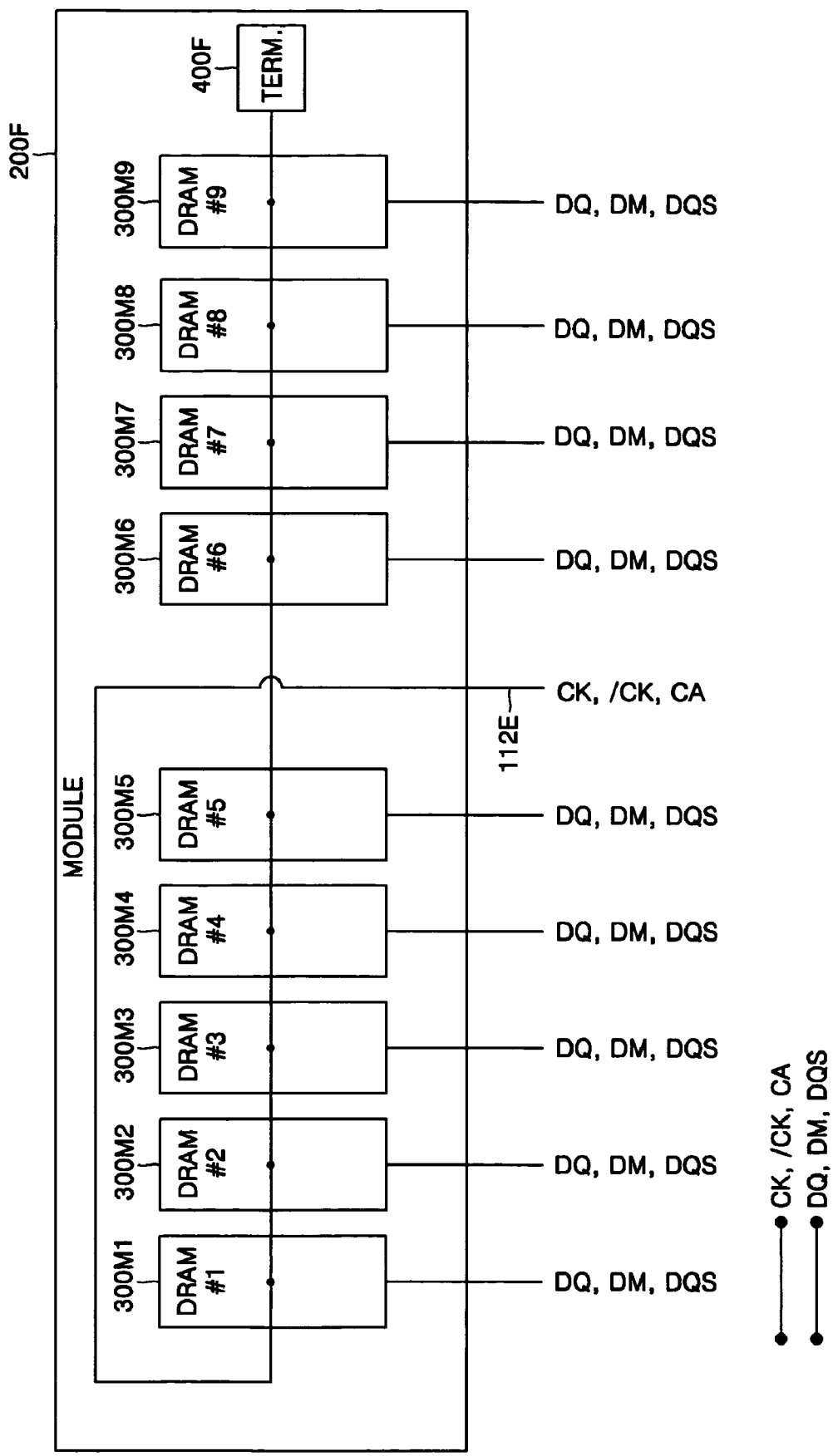
FIG. 21 is a block diagram illustrating still more topologies for memory modules according to embodiments of the present invention.

As shown in FIG. 21, a fly-by topology for the clock/command/address bus 112 may be provided with the clock/command/address bus 112 entering the memory module 200F between memory devices in the row of memory devices 300M1-300M9. Such a topology may provide an advantageous layout for coupling with a memory controller.

As discussed above, selective mode register set operations according to embodiments of the present invention may be used to selectively adjust timings of internal clock signals of different memory devices sharing a same clock/command/address bus. In addition or in an alternative, selective mode register set operations according to embodiments of the present invention may be used to selectively set, adjust, and/or change operational characteristics of memory devices sharing a same clock/command/address bus other than internal clock signal timing. For example, selective mode register set operations according to embodiments of the present invention may be used to set different driver strengths for different memory devices sharing a same clock/command/address bus.

For example, each memory device 300M1-300M9 of memory module 200 may include a respective data I/O buffer 330 as discussed above with respect to FIGS. 5 and 6. Moreover, the data signals DATA for each memory device 300 may include a plurality of data bits DQ, and the internal data signals iDATA for each memory device 300 may include a respective plurality of internal data bits iDQ. Accordingly, the data I/O buffer 330 may include a plurality of output drivers 150 provided to convert each internal data bit iDQ to a respective data bit DQ provided on a respective I/O pin 152 of the memory device as shown, for example, in FIG. 22.

More particularly, the output driver 150 may have a primary driver circuit including transistors 130 and 140 and a supplemental driver circuit including transistors 132, 134, 142, and 144. During a read operation, an internal data bit iDQ having a logic value "1" may turn transistor 140 on and turn transistor 130 off so that I/O pin 152 is coupled through transistor 140 to ground voltage VSS and data bit DQ has a logic value "0". During a read operation, an internal data bit iDQ having a logic value "0" may turn transistor 140 off and turn transistor 130 on so that I/O pin 152 is coupled through transistor 130 to power supply voltage VDD and data bit DQ has a logic value "1". The primary driver circuit including transistors 130 and 140 thus performs the logical function of the output driver 150. The secondary driver circuit including transistors 132, 134, 142, and 144 may be disabled by providing the signal CON with a logic value "0" and by providing the inverse signal /CON with a logic value "1" so that transistors 132 and 142 are turned off.

A strength of the output driver 150 may be increased by providing the signal CON with a logic value "1" and by providing the inverse signal /CON with a logic value "0" so that transistors 132 and 142 are turned on and the secondary driver circuit is enabled. During a read operation with the secondary driver circuit enabled, an internal data bit iDQ having a logic value "1" may turn transistors 140 and 144 on and turn transistors 130 and 134 off so that I/O pin 152 is coupled through transistors 140 and 144 to ground voltage VSS and data bit DQ has a logic value "0". During a read operation with the secondary driver circuit enabled, an internal data bit iDQ having a logic value "0" may turn transistors 140 and 144 off and turn transistors 130 and 134 on so that I/O pin 152 is coupled through transistors 130 and 134 to power supply voltage VDD and data bit DQ has a logic value "1". With the secondary driver circuit enabled, the primary and secondary driver circuits perform the logical function of the output driver 150 in parallel thereby increasing a driver strength of output driver 150.

Selective mode register set operations may thus be performed for each of the memory devices 300M1-300M9 to set different output driver characteristics for different memory devices sharing a same clock/command/address bus 112. As discussed above, a selective mode register set command may be provided over address lines of the clock/command/address bus 112 during the mode register set operation, and an enabling mode register set enable/disable signal may be provided to the memory device(s) for which the mode register set command is to be applied. Moreover, a logic value of a single bit of the mode register set command may define whether all output drivers of the memory device should provide increased or reduced driver strength. In an alternative, a first selective mode register set operation may be performed for a first plurality of the memory devices for which a first output driver strength is desired, and a second selective mode register set operation may be performed for a second plurality of the memory devices for which a second output driver strength is desired.

In another alternative, a selective mode register operation may provide for different driver strengths of output drivers on a same memory device. For example, data signals DATA for a memory device may include eight data bits DQ and each memory device may include eight respective output drivers. Accordingly, eight bits of a selective mode register set command for a memory device may define a driver strength for eight respective output drivers.

Figure 23:
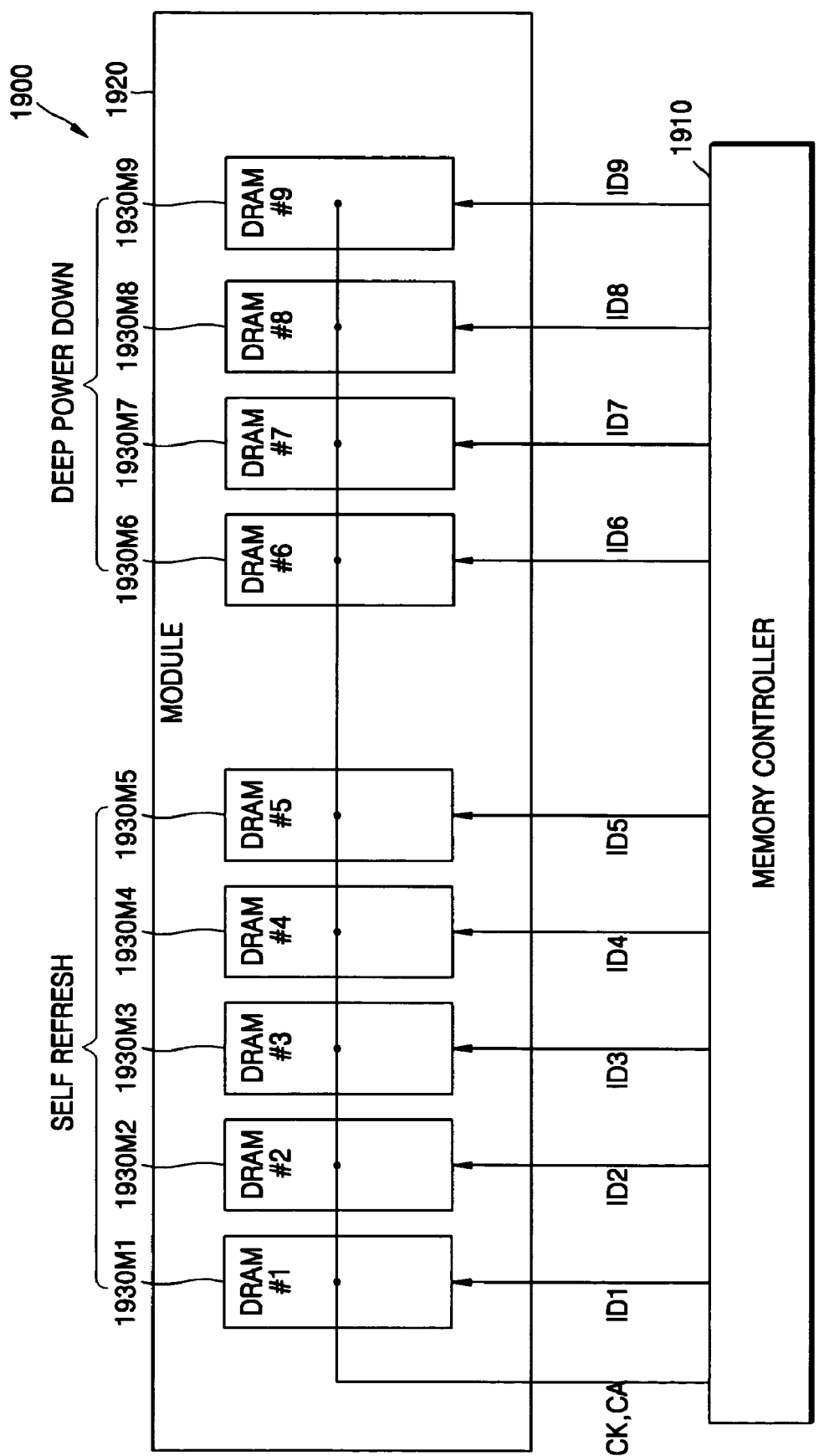
FIG. 23 is a block diagram illustrating memory systems including memory modules and memory controllers according to still more embodiments of the present invention.

FIG. 23 is a block diagram of a memory system 1900 according to some embodiments of the present invention. Referring to FIG. 23, the memory system 1900 includes a memory controller 1910 and a memory module 1920 including a plurality of memory devices 1930M1 through 1930M9. The memory controller 1910 controls the memory devices 1930M1 through 1930M9 using a clock signal CK and a command address signal CA, and generates identification signals ID1 through ID9 used to selectively control the memory devices 1930M1 through 1930M9, respectively.

In a first mode, the memory devices 1930M1 through 1930M9 are respectively set to different operation modes in response to identification signals ID1 through ID9 and a command address signal CA. In a second mode, the memory devices 1930M1 through 1930M9 operate in the set operation modes in response to a predetermined command address signal CA.

Here, the first mode may be used to set the memory devices 1930M1 through 1930M9 to corresponding operation modes before the memory devices 1930M1 through 1930M9 perform read/write operations, and the second mode may be used to perform read/write operations of the memory devices 1930M1 through 1930M9.

In the first mode, the memory devices 1930M1 through 1930M9 may be respectively set to corresponding operation modes in response to a command address signal CA. At this time, whether or not an operation mode of each memory device should be set depends on the activation of a corresponding identification signal ID1 through ID9.

Each memory device 1930M1 through 1930M9 may be set to a corresponding operation mode in response to a command address signal CA if a corresponding identification signal ID1 through ID9 is activated. If the corresponding identification signal ID1 through ID9 is deactivated, the respective memory device 1930M1 through 1930M9 does not respond to the command address signal CA. Accordingly, it is possible to set the operation modes of the memory devices 1930M1 through 1930M9 different from each other using the respective identification signals ID1 through ID9. For example, identification signals ID1 through ID5 (corresponding to the memory devices 1930M1 through 1930M5) may be activated, and identification signals ID6 through ID9 (corresponding to the memory devices 1930M6 through 1930M9) may be deactivated while a command address signal CA is applied. Accordingly, only the memory devices 1930M1 through 1930M5 are set to an operation mode in response to the command address signal CA, and the memory devices 1930M6 through 1930M9 do not respond to the command address signal CA. Thereafter, if the identification signals ID1 through ID5 are deactivated, the identification signals ID6 through ID9 are activated, and a command address signal CA for setting a different operation mode is applied, an operation mode of the memory devices 1930M6 through 1930M9 may be different from that of the memory devices 1930M1 through 1930M5. After the memory devices 1930M1 through 1930M9 are set to different operation modes in the first mode, in the second mode, a predetermined command address signal CA may be applied to operate the memory devices 1930M1 through 1930M9 in the different operation modes.

According to embodiments of the present embodiment, if identification signals ID1 through ID5 (corresponding to the memory devices 1930M1 through 1930M5) are activated, the memory devices 1930M1 through 1930M5 may be set to a refresh mode in response to a command address signal CA. If identification signals ID6 through ID9 (corresponding to the memory devices 1930M6 through 1930M9) are activated, the memory devices 1930M6 through 1930M9 may be set to a deep power down mode in response to a command address signal CA.

In a deep power down mode, internal voltage sources of memory devices may be turned off and external voltage sources of the memory devices may be maintained turned on. Accordingly, in a memory device that is in the deep power down mode, no refresh operations are performed. That is, while a command address signal CA used to set a refresh mode is applied, the identification signals ID1 through ID5 corresponding to the memory devices 1930M1 through 1930M5 are activated, and the identification signals ID6 through ID9 corresponding to the memory devices 1930M6 through 1930M9 are deactivated. Accordingly, the memory devices 1930M1 through 1930M5 may be set to a refresh mode in response to the command address signal CA applied to the memory devices 1930M1 through 1930M5, and the remaining memory devices 1930M6 through 1930M9 cannot be set to the refresh mode.

Thereafter, if the identification signals ID1 through ID5 are deactivated, the identification signals ID6 through ID9 may be activated, and a command address signal CA used to set a deep power down mode is applied, the memory devices 1930M6 through 1930M9 may be set to the deep power down mode. The internal configuration of each memory device (which is set to a refresh mode or a deep power down mode in response to identification signals ID1 through ID9 and a command address signal CA) will be understood by those skilled in the art.

In a second mode with the memory module 1930 operating normally, if a command address signal CA used to command a refresh operation is applied, the memory devices 1930M1 through 1930M5 may perform refresh operations and the memory devices 1930M6 through 1930M9 may operate in the deep power down mode. It is also possible that a command address signal CA used to command a deep power down operation, instead of the command address CA used to command the refresh operation, may be applied. That is, in the second mode, the command address signal CA used to operate the memory devices in the different operation modes can be arbitrarily set. By setting memory devices storing data which should be preserved to the refresh mode and setting memory devices storing data which may be erased to the deep power down mode power consumption may be reduced.

Embodiments of the present invention may be provided using memory module 1920 shown in FIG. 23, and can be applied to various memory module structures shown in FIGS. 5 through 22.

Figure 24:
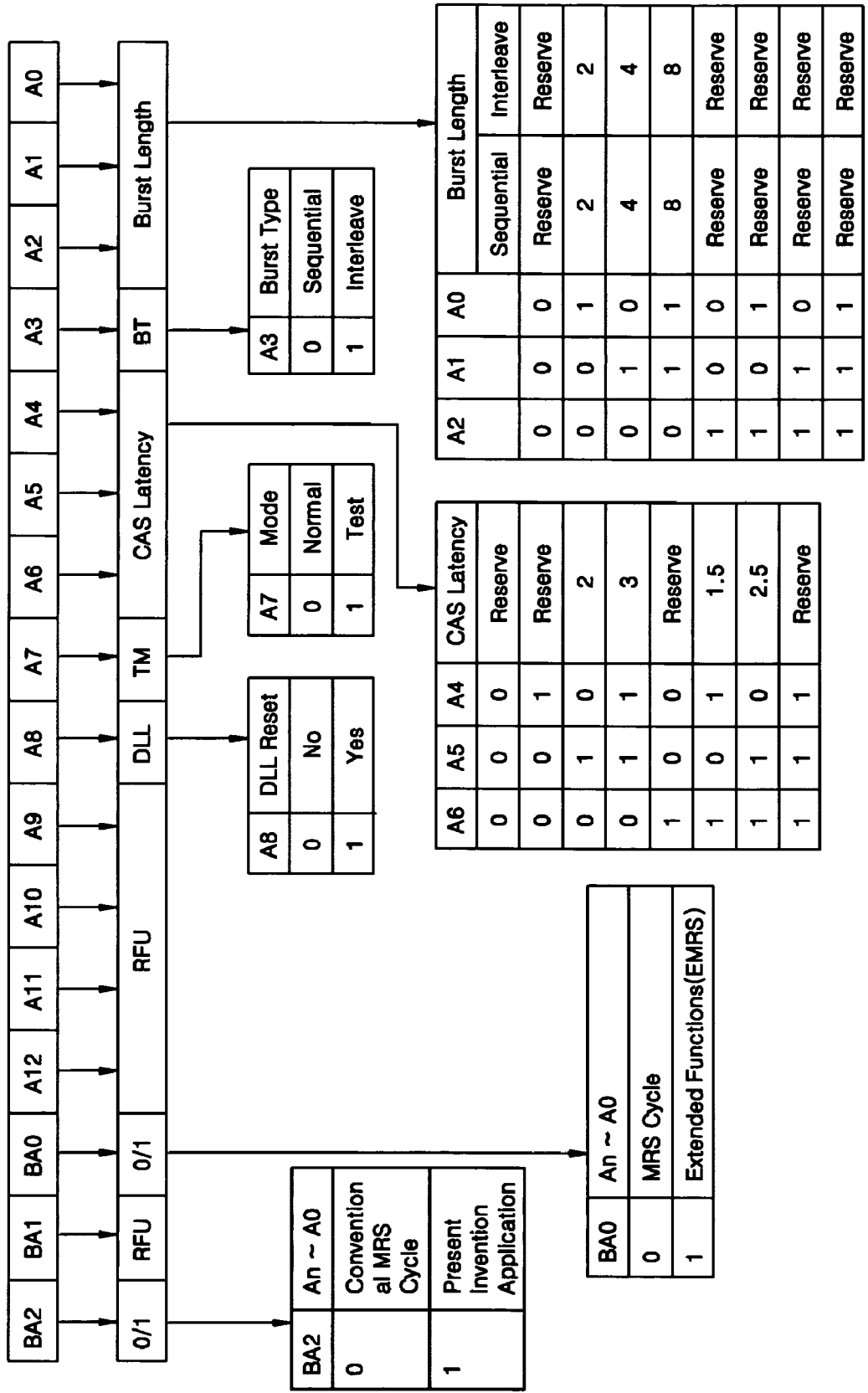
FIG. 24 is a table illustrating mode register set commands according to embodiments of the present invention.

The command address signal CA generated by the memory controller 1910 may be a MRS (Mode Register Set) command described further with reference to FIG. 24. FIG. 24 is a table illustrating MRS commands according to embodiments of the present invention. In general, a MRS command includes an address code section (A0 through A12) and two bank address sections (BA0 and BA1). Values, such as burst length and CAS latency, may be decided according to address codes.

According to embodiments of the present invention, whether or not a current cycle is a MRS cycle may be decided according to a bank address. The address code and the bank address may together be called a 'MRS key address code'. A MRS command used according to embodiments of the present invention may further include a third bank address BA2.

According to embodiments of the present invention, whether the memory controller 1910 should activate an identification signal ID may be decided according to a third bank address BA2 of a MRS key address code of a MRS command. If the third bank address BA2 is low, the memory controller 1910 may deactivate the identification signal ID. This may be the same as in a conventional MRS command without the third bank address BA2 of the MRS key address code.

In contrast, if the third bank address BA2 of the MRS key address code is high, the memory controller 1910 may activate and output the identification signal ID. According to embodiments of the present invention, if a third bank address BA2 of a command address signal CA (that is, MRS command) is high, the memory devices 1930M1 through 1930M9 can be set to a refresh mode or a deep power down mode according to address codes A0 through A12. The MRS command can define various operation modes, as shown in FIG. 24. For example, if a third bank address BA2 is low, a second bank address BA1 may be preserved so that it can be used later (RFU). If a first bank address BA0 is low, a mode register set (MRS) cycle may be selected. As used herein, the acronym "RFU" means reserved for future use.

If the first bank address BA0 is high, an expanded mode register set (EMRS) cycle may be selected. In a MRS cycle, address codes A9 through A12 may be preserved so that they can be used later (RFU) and an address code A8 may control a delay locked loop (DLL) reset command.

An address code A7 may control a test command TM, address codes A4 through A6 may control a CAS latency command, an address code A3 may control a burst type BT command, and address codes A0 through A3 may control a burst length command.

As described above, the memory devices 1930M1 through 1930M9 of the memory system 1900 shown in FIG. 23 may separately perform refresh operations and deep power down operations in response to a predetermined command address signal CA. That is, the memory devices 1930M1 through 1930M9 may perform different operations in response to the same command address signal CA.

Each of the identification signals ID1 through ID9 can be input to one of a data pin, a data mask pin, and/or a data strobe pin of a corresponding one of the memory devices 1930M1 through 1930M9, similar to that of embodiments illustrated in FIG. 5.

Figure 25:
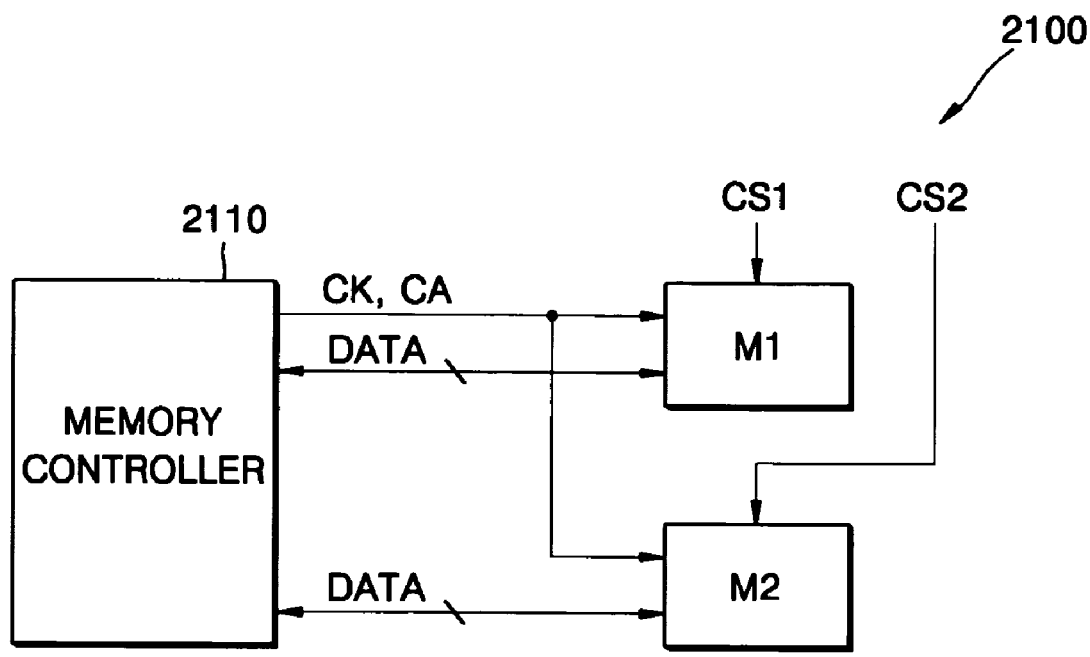
FIG. 25 is a block diagram illustrating more memory systems according to embodiments of the present invention.

FIG. 25 is a block diagram of a memory system 2100 according to other embodiments of the present invention. Referring to FIG. 25, the memory system 2100 may include a first memory device M1 and a second memory device M2. The first memory device M1 and the second memory device M2 may perform different operations in response to a command address signal CA.

In a first mode, the first memory device M1 may be set to a different operation mode than the second memory device M2 in response to a chip selection signal CS1 or CS2 and a predetermined command address signal CA. The memory system 2100 further includes a memory controller 2110 used to control operations of the first and second memory devices M1 and M2 using a clock signal CK and the command address signal CA and generating the chip selection signals CS1 and CS2.

Like the memory devices 1930M1 through 1930M9 of the memory module 1920 shown in FIG. 23, in the memory system 2100 shown in FIG. 25, the first and second memory devices M1 and M2 may be respectively set to different operation modes according to the command address signal CA.

Generally, a mobile apparatus may include memory chips, instead of memory modules. In the memory system 2100 shown in FIG. 25, technical concepts of embodiments of the present invention may be applied to a mobile apparatus.

Here, chip selection signals CS1 and CS2 may be used instead of the identification signal ID shown in FIG. 23. In a first mode, the first and second memory devices M1 and M2 may be set to corresponding operation modes in response to a command address signal CA if the chip selection signals CS1 and CS2 are activated. If the chip selection signals CS1 and CS2 are deactivated, the first and second memory devices M1 and M2 may not respond to the command address signal CA.

In more detail, in the first mode, the first memory device M1 may be set to a refresh mode in response to the command address signal CA if the chip selection signal CS1 is activated. At this time, the chip selection signal CS2 may maintain deactivated.

Also, in the command address signal CA, as described above, the third bank address BA2 may be high and the address codes A0 through A12 may store information for controlling the refresh operation of the first memory device M1.

If the chip selection signal CS1 is deactivated and a chip selection signal CS2 applied to the second memory device M2 is activated, the second memory device M2 may be set to a deep power down mode in response to the command address signal CA.

Because the operation modes of the first memory device M1 and the second memory device M2 are set different from each other in the first mode, the first and second memory devices M1 and M2 may perform different operations in response to the same command address signal CA in a normal operation mode. Accordingly, by setting memory devices storing data which should be preserved to a refresh mode and setting memory devices storing data which may be erased to a deep power down mode, it is possible to reduce power consumption.

The first memory device M1 and the second memory device M2 may directly receive a clock signal CK and a command address signal CA from the memory controller 2110. However, it will be apparent to those skilled in the art that memory system structures wherein memory devices operate in different operation modes in response to a command address signal CA, are not limited to the memory system 2100 shown in FIG. 25.

Figure 26:
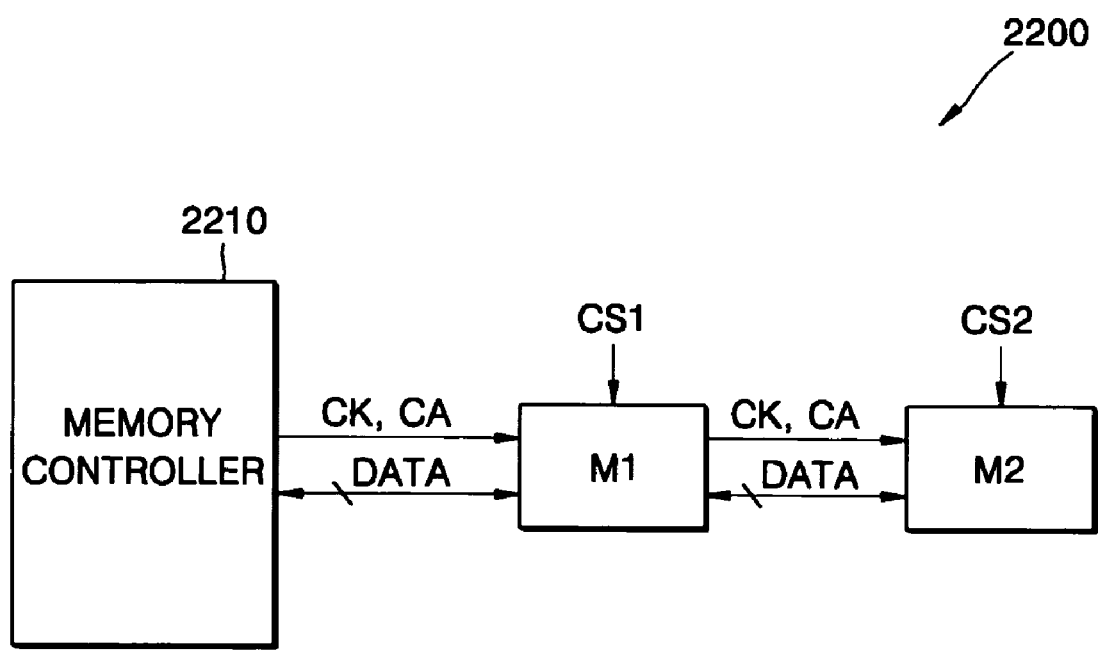
FIG. 26 is a block diagram illustrating still more memory systems according to embodiments of the present invention.

FIG. 26 is a block diagram of a memory system 2200 according to additional embodiments of the present invention. In the memory system 2200, a first memory device M1 may directly receive a clock signal CK and a command address signal CA from a memory controller 2210 and a second memory device M2 may receive the clock signal CK and the command address signal CA through the first memory device M1. The memory system 2200 may operate in the same manner as the memory system 2100 shown in FIG. 25.

Figure 27:
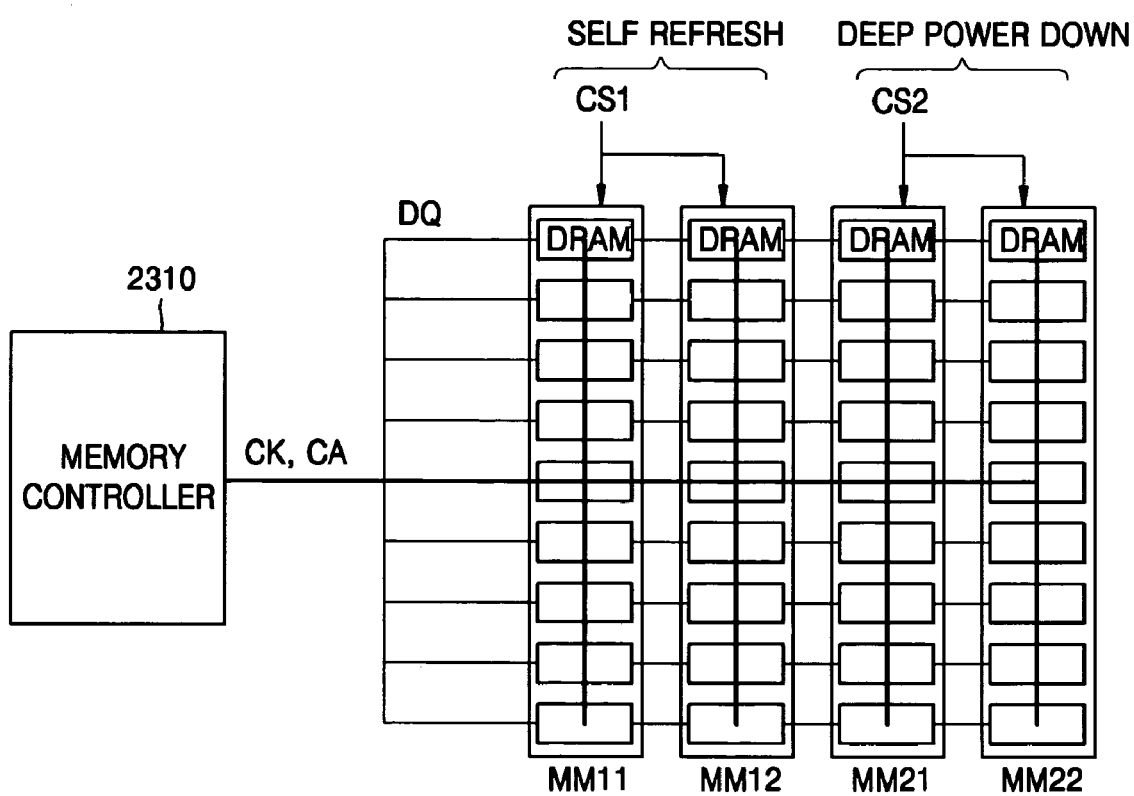
FIG. 27 is a block diagram illustrating yet more memory systems according to embodiments of the present invention.

FIG. 27 is a block diagram of a memory system 2300 according to still additional embodiments of the present invention. In the memory system 2300, technical concepts of embodiments of the present invention described with reference to FIGS. 23 through 26 may be applied to a plurality of memory modules. The memory system 2300 includes first memory modules MM11 and MM12 and second memory modules MM21 and MM22, wherein each memory module includes a plurality of memory devices.

The first and second memory modules MM11, MM12, MM21, and MM22 may perform different operations in response to a command address signal CA in a normal operation mode. The first memory modules MM11 and MM12 may be set to a refresh mode according to a command address signal CA, in response to the activation of a first chip selection signal CS1. At this time, a second chip selection signal CS2 may remain deactivated.

Also, in the command address signal CA, as described above, a third bank address BA2 may be high and address codes A0 through A12 may store information for controlling refresh operations of the first memory modules MM11 and MM12. Thereafter, if the first chip selection signal CS1 is deactivated and a second chip selection signal CS2 applied to the second memory modules MM21 and MM22 is activated, the second memory modules MM21 and MM22 may be set to a deep power down mode in response to the command address signal CA.

Accordingly, if the operation mode of the first memory modules MM11 and MM12 is set different from that of the second memory modules MM21 and MM22 in the first mode, the first memory modules MM11 and MM12 may perform a different operation than the second memory modules MM21 and MM22 in response to the same command address signal CA in a normal operation mode.

Therefore, by setting memory modules storing data which should be preserved to a refresh mode and setting memory modules storing data which may be erased to a deep power down mode, it is possible to reduce power consumption. The memory system 2300 shown in FIG. 27 may operate in the same manner as the memory systems 1900, 2100, and 2200 shown in FIGS. 23 through 26.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A method of operating a memory system comprising a plurality of memory devices coupled to a command address bus, the method comprising:
    setting a first memory device of the plurality of memory devices to a first operating mode;
    setting a second memory device of the plurality of memory devices to a second operating mode different than the first operating mode;
    performing a read/write operation responsive to a read/write command address signal provided over the command address bus to the plurality of memory devices so that the first memory device operates according to the first operating mode during the read/write operation and so that the second memory device operates according to the second operating mode during the read/write operation.

2. A method according to claim 1 wherein setting the first memory device to the first operating mode comprises providing a first mode set command address signal to the plurality of memory devices and providing an identification signal to the first memory device without providing an identification signal to the second memory device.

3. A method according to claim 2 wherein setting the second memory device to the second operating mode comprises providing a second mode set command address signal to the plurality of memory devices and providing an identification signal to the second memory device without providing an identification signal to the first memory device.

4. A method according to claim 3 wherein providing the identification signals to the first and second memory devices comprises providing the identification signals to one of a data pin, a data mask pin, and/or a data strobe pin of the respective memory device.

5. A method according to claim 2 wherein the first mode set command address signal comprises a Mode Register Set (MRS) command.

6. A method according to claim 1 wherein the first operating mode comprises a refresh mode and wherein the second operating mode comprises a deep power down mode.

7. A method according to claim 1 wherein performing the read/write operation comprises performing the read/write operation responsive to the read/write command address signal and responsive to a clock signal provided over the command address bus to the plurality of memory devices.

8. A memory system comprising:
    a memory module including a plurality of memory devices; and
    a memory controller coupled to the memory module,
    wherein the memory controller is configured during a mode set operation to provide an identification signal to a first memory device of the plurality of memory devices without providing an identification signal to a second memory device of the plurality of memory devices to set the first memory device to a first operation mode different than a second operation mode of the second memory device, and
    wherein the memory controller is configured during a read/write operation to read/write data from/to at least one of the plurality of memory devices with the first memory device operating according to the first operation mode and with the second memory device operating according to the second operation mode.

9. A memory system according to claim 8 wherein the memory controller is configured to provide a first command address signal to the plurality of memory devices during the mode set operation and to provide a second command address signal to the plurality of memory devices during the read/write operation, wherein the first and second command address signals are different.

10. A memory system according to claim 9 wherein the first command address signal comprises a Mode Register Set (MRS) command.

11. A memory system according to claim 10 wherein the memory controller is configured to generate the identification signal when a third bank address of three bank addresses of the Mode Register Set command is high during the mode set operation.

12. A memory system according to claim 11 wherein the memory controller is configured to suppress the identification signal when the third bank address of the three bank addresses of the Mode Register Set command is low during a second mode set operation.

13. A memory system according to claim 8 wherein during the mode set operation, the identification signal is activated for the first memory device and deactivated for the second memory device.

14. A memory system according to claim 8 wherein the first operation mode comprises a refresh mode and the second operation mode comprises a deep power down mode.

15. A memory system according to claim 8 wherein the identification signal is provided from the memory controller to one of a data pin, a data mask pin, and/or a data strobe pin of the first memory device.

16. A memory system comprising:
    a first plurality of memory devices coupled to a command address signal bus, wherein during a read/write operation, the first plurality of memory devices are configured to operate according to a first operation mode responsive to a command address signal on the command address signal bus; and
    a second plurality of memory devices coupled to the command address signal bus, wherein during the read/write operation, the second plurality of memory devices are configured to operate according to a second operation mode responsive to the command address signal on the command address signal bus.

17. A memory system according to claim 16 wherein the first plurality of memory devices are configured to change to the second operation mode responsive to an identification signal provided to the first plurality of memory devices and a command address signal provided to the first and second pluralities of memory devices.

18. A memory system according to claim 16 wherein the first operation mode comprises a refresh mode and the second operation mode comprises a deep power down mode.

19. A memory system according to claim 16 wherein the first and second pluralities of memory devices are configured to operate responsive to the command address signal and responsive to a clock signal on the command address signal bus.

20. A memory system according to claim 16 further comprising:
    a memory controller coupled to the command address signal bus wherein the memory controller is configured to generate the command address signal.

* * * * *